United States Patent
Okabayashi et al.

[11] Patent Number: 5,483,200
[45] Date of Patent: Jan. 9, 1996

[54] LIGHT-RECEIVING AND AMPLIFYING DEVICE CAPABLE OF SWITCHING BETWEEN GAIN LEVELS AT HIGH SPEED AND OBTAINING A SUFFICIENT SIGNAL-TO-NOISE RATIO OVER A WIDE RANGE IN QUANTITY OF INCIDENT LIGHT

[75] Inventors: Naonori Okabayashi, Sakurai; Koichi Hanafusa; Masaya Ohnishi, both of Kitakatsuragi, all of Japan

[73] Assignee: Sharp Kabushiki Kaisha, Osaka, Japan

[21] Appl. No.: 257,741

[22] Filed: Jun. 8, 1994

[30] Foreign Application Priority Data

| Jun. 8, 1993 | [JP] | Japan | 5-137610 |
| Jun. 8, 1993 | [JP] | Japan | 5-137612 |
| Aug. 24, 1993 | [JP] | Japan | 5-209350 |
| Dec. 10, 1993 | [JP] | Japan | 5-310229 |

[51] Int. Cl.$^6$ ............................. H03F 3/08; H03G 3/12
[52] U.S. Cl. ................ 330/308; 330/282; 250/214 AG
[58] Field of Search ............... 250/214 A, 214 AG; 330/110, 278, 282, 288, 308, 59, 86

[56] References Cited

U.S. PATENT DOCUMENTS

| 4,491,800 | 1/1985 | Miyata | 330/282 X |
| 4,673,807 | 6/1987 | Kobayashi et al. | 250/214 AG |
| 4,757,192 | 7/1988 | Oltmann | 250/214 AG |

FOREIGN PATENT DOCUMENTS

| 63-62132 | 12/1988 | Japan. |
| 3-106106 | 5/1991 | Japan. |

*Primary Examiner*—Steven Mottola
*Attorney, Agent, or Firm*—Nixon & Vanderhye

[57] ABSTRACT

There is provided a light-receiving and amplifying device capable of changing its gain at high speed. A cathode of a photodiode PD is connected to a power source $V_{CC}$ via a current mirror circuit. An anode of the photodiode PD is connected to an input of an amplifier circuit AMP. The amplifier circuit AMP receives a photocurrent from the photodiode PD, converts the photocurrent into a voltage, and amplifies the voltage to form an output signal $V_{OUT}$. A control signal of a current having the same magnitude as that of the photocurrent and output from the current mirror circuit is input to a control input terminal of a gain switching circuit. The gain switching circuit is composed of a resistor $Rf_1$, a resistor $Rf_2$, and a switch SW. The resistor $Rf_1$ is connected across the input and the output of the amplifier circuit AMP, and the resistor $Rf_2$ and the switch SW connected in series are connected across the input and the output of the amplifier circuit AMP.

12 Claims, 10 Drawing Sheets

LIGHT-RECEIVING AND AMPLIFYING DEVICE CAPABLE OF SWITCHING BETWEEN GAIN LEVELS AT HIGH SPEED AND OBTAINING A SUFFICIENT SIGNAL-TO-NOISE RATIO OVER A WIDE RANGE IN QUANTITY OF INCIDENT LIGHT

BACKGROUND OF THE INVENTION

1. Field of the Invention

The present invention relates to a light-receiving and amplifying device for use in a pickup for a mini-disc player, a magneto-optic disc player, a multi-disc player, or the like.

2. Description of the Prior Art

There has been conventionally provided a photodiode for a light-receiving and amplifying device as shown in FIGS. 1 and 2, where a rectangular N-type epitaxial layer 3 is formed as isolated from its periphery by a P-type isolation diffusion layer 2, and four rectangular P-type diffusion layers 4a, 4b, 4c, and 4d are arranged in a lengthwise direction on the N-type epitaxial layer 3. Between a bottom surface of the rectangular N-type epitaxial layer 3 and the P-type isolation diffusion layer 2 is formed an $N^+$ buried layer 5. The N-type epitaxial layer 3 and the P-type diffusion layers 4a, 4b, 4c, and 4d are forming four photodiodes $PD_A$, $PD_B$, $PD_C$, and $PD_D$. The photodiodes $PD_A$ through $PD_D$ structurally have a common cathode. Between the P-type isolation diffusion layer 2 and the N-type epitaxial layer 3 there is a parasitic photodiode $PD_E$, and the parasitic photodiode $PD_E$ structurally has its cathode common to the cathodes of the photodiodes $PD_A$ through $PD_D$. A connector compensation diffusion layer 6 for separating a peripheral region 3a of the N-type epitaxial layer 3 from an inner region 3b which includes the inner P-type diffusion layers 4a through 4d is further formed to lead the common cathode of the photodiodes $PD_A$ through $PD_D$ and the parasitic photodiode $PD_E$ to the outside thereof through the connector compensation diffusion layer 6.

FIG. 3 shows an equivalent circuit diagram of a light-receiving and amplifying device employing the photodiodes $PD_A$ through $PD_D$. The cathodes of the photodiodes $PD_A$ through $PD_D$ and the cathode of the parasitic photodiode $PD_E$ are connected to a power source $V_{CC}$. The anodes of the photodiodes $PD_A$ through $PD_D$ are connected to amplifiers $AMP_A$ through $AMP_D$ respectively, while the anode of the parasitic photodiode $PD_E$ is connected to the ground GND. When the photodiodes $PD_A$ through $PD_D$ receive incident light, photocurrents $IPD_A$, $IPD_B$, $IPD_C$, and $IPD_D$ flow through the photodiodes. Then the amplifiers $AMP_A$ through $AMP_D$ convert the photocurrents $IPD_A$ through $IPD_D$ into voltages and amplify the voltages to form voltage outputs $V_A$, $V_B$, $V_C$, and $V_D$. When the parasitic photodiode $PD_E$ receives incident light, a photocurrent $IPD_E$ also flows through the parasitic photodiode.

A pickup employing the light-receiving and amplifying device having the above-mentioned construction reproduces a signal recorded on a disc or the like through signal processing such as calculation based on the voltage outputs $V_A$ through $V_D$.

In the pickup of a mini-disc player, a magnetooptic disc player, a multi-disc player, or the like, the quantity of light incident on the photodiodes changes depending on whether the player is in the reproduction stage or in the recording stage. In practice, the quantity of incident light in the recording stage is greater than in the reproduction stage. Furthermore, since the reflectance differs depending on the type of the disc, the quantity of incident light varies. The performance of the pickup depends on how much the signal-to-noise ratio can be increased when the quantity of incident light is at minimum and the signal component is small in condition where the quantity of incident light varies. The noise level for determining the signal-to-noise ratio varies according to the feedback resistor of the amplifier circuit. Assuming that the input current of the amplifier circuit is iS and the equivalent input current noise is iN, the equivalent input noise current can be obtained by the mean square of a thermal noise iNR due to the feedback resistor of the amplifier circuit and the other noise iNS such as shot noise. Assuming now that the feedback resistor of the amplifier circuit is Rf, the thermal noise iNR due to the feedback resistor Rf can be expressed as:

$$iNR = 4KTB/Rf$$

where K is the Boltzmann's constant of $1.38 \times 10^{-23}$, J/°K., T is the absolute temperature, and B is a bandwidth. Therefore, the signal-to-noise ratio S/N of the amplifier circuit can be expressed as:

$$\begin{aligned} S/N &= iS \times Rf/((iNR^2 + iNS^2)^{1/2} \times Rf) \\ &= iS/(16K^2T^2B^2/Rf^2 + iNS^2)^{1/2} \end{aligned}$$

which results in an increase of the signal-to-noise ratio S/N as the resistance of the feedback resistor Rf increases. However, when a gain of each of the amplifiers $AMP_A$ through $AMP_D$ is increased according to the small quantity of incident light in the reproduction stage, the outputs $V_A$ through $V_D$ of the amplifiers $AMP_A$ through $AMP_D$ are possibly saturated when the quantity of incident light is increased. In contrast, when the gain of each of the amplifiers $AMP_A$ through $AMP_D$ is reduced in accordance with the great quantity of incident light in the recording stage, the signal-to-noise ratios S/N of the outputs $V_A$ through $V_D$ of the amplifiers $AMP_A$ through $AMP_D$ are problematically deteriorated when the quantity is of incident light is reduced.

SUMMARY OF THE INVENTION

Accordingly, a first object of the present invention is to provide a light-receiving and amplifying device capable of preventing possible saturation of an amplifier circuit and increasing its signal-to-noise ratio by changing over between two or more gain levels according to the quantity of incident light.

A second object of the present invention is to provide a light-receiving and amplifying device capable of changing over between gain levels at high speed by reducing the time required for a switching operation of a gain switching circuit as far as possible.

A third object of the present invention is to provide a light-receiving and amplifying device capable of obtaining a sufficient signal-to-noise ratio over a wide range in quantity of incident light while suppressing the excessive increase of a circuit current.

In order to achieve the first object, there is provided a light-receiving and amplifying device having a photodiode and an amplifier circuit which amplifies a photocurrent from the photodiode through current-to-voltage conversion of the photocurrent, the light-receiving and amplifying device comprising: a gain switching circuit which switches the amplifier circuit between two or more gain levels.

According to the above-mentioned light-receiving and amplifying device, the photocurrent of the photodiode is converted into a voltage and then amplified by the amplifier circuit. In the above stage, the gain switching circuit can switch the amplifier circuit between two or more gain levels according to the photocurrent of the photodiode. The gain is thus set up according to the photocurrent of the photodiode. When the photocurrent of the photodiode is great, the amplifier circuit can be prevented from being saturated by reducing the gain. When the photocurrent of the photodiode is small, the signal-to-noise ratio can be increased by increasing the gain.

With the above-mentioned arrangement, a light-receiving and amplifying device in which the amplifier circuit is not saturated and a high signal-to-noise ratio is achieved can be obtained.

Also, the gain switching circuit comprises at least one set of a resistor and a switching element connected in series across an input and an output of the amplifier circuit, and an external selection signal is input to a control terminal of the switching element.

According to the above-mentioned device, the gain switching circuit turns on and off the switching element according to the external selection signal input to the control terminal. Then, based on the resistor connected in series with the switching element across the input and the output of the amplifier circuit, the gain of the light-receiving and amplifying device is switched. The resistor of the gain switching circuit is thus set up according to the photocurrent of the photodiode. When the photocurrent of the photodiode is great, the amplifier circuit can be prevented from being saturated by reducing the gain. When the photocurrent of the photodiode is small, the signal-to-noise ratio can be increased by increasing the gain.

With the above-mentioned arrangement, a light-receiving and amplifying device in which the amplifier circuit is not saturated and a high signal-to-noise ratio is achieved can be obtained.

In order to achieve the second object, there is provided a light-receiving and amplifying device having a photodiode and an amplifier circuit which amplifies a photocurrent from the photodiode through current-to-voltage conversion of the photocurrent, the light-receiving and amplifying device comprising: a current mirror circuit which outputs a control signal of a current having a magnitude approximately equal to a magnitude of the photocurrent from the photodiode; and a gain switching circuit including at least one set of a resistor and a switching element connected in series across an input and an output of the amplifier circuit, wherein an external selection signal and the control signal output from the current mirror circuit are input to a control terminal of the switching element.

According to the light-receiving and amplifying device having the above-mentioned construction, the photocurrent of the photodiode is converted into a voltage and then amplified by the amplifier circuit. Meanwhile, the current mirror circuit outputs a control signal of a current having approximately the same magnitude as that of the photocurrent of the photodiode. Then the gain switching circuit selects the switching element according to the external selection signal, and inputs the control signal to the control terminal of the selected switching element. The selected switching element is turned on to change the gain of the light-receiving and amplifying device by means of the feedback resistance implemented by the resistor connected in series with the switching element across the input and the output of the amplifier circuit.

As described above, the current flowing through the control terminal of the selected switching element of the gain switching circuit is made to have approximately the same magnitude as that of the photocurrent of the photodiode. Meanwhile, the feedback current of the switching element is approximately proportional to the current flowing through the control terminal of the switching element. With the above-mentioned arrangement, when the feedback current of the switching element is increased or decreased according to the photocurrent of the photodiode, the current flowing through the control terminal is increased or decreased approximately in proportion to the increase or decrease of the feedback current to make the switching time approximately constant to eliminate variation. Therefore, the switching time can be made approximately constant and fast regardless of the change in quantity of light incident on the photodiode and the variation of the current flowing through the control terminal of the switching element. The above arrangement can reduce the switching time of the gain switching circuit to allow the gain of the light-receiving and amplifying device to be changed at high speed.

Also, there is provided a light-receiving and amplifying device having a photodiode and an amplifier circuit which amplifies a photocurrent from the photodiode through current-to-voltage conversion of the photocurrent, the light-receiving and amplifying device comprising: a gain switching circuit including at least one set of a resistor and a switching element connected in series across an input and an output of the amplifier circuit; and a current mirror circuit which generates a control signal of a specified current correlating with a current amplification factor according to an external selection signal level and supplies the control signal to a control terminal of the switching element of the gain switching circuit.

According to the above-mentioned construction, the control signal having the specified current correlating with the current amplification factor is generated by the current mirror circuit according to the level of the external selection signal and then supplied to the control terminal of the switching element of the gain switching circuit. Then the gain of the amplifier circuit is changed and set up at high speed in a stable operation time by the switching element of the gain switching circuit according to the control signal having the constant current without variation.

Then the photocurrent from the photodiode is converted into a voltage and amplified by the amplifier circuit of which gain has been appropriately set up according to the level of the selection signal.

In order to achieve the third object, there is provided a light-receiving and amplifying device having a photodiode and an amplifier circuit which amplifies a photocurrent from the photodiode through current-to-voltage conversion of the photocurrent, the light-receiving and amplifying device comprising: a gain switching circuit which changes a gain of the amplifier circuit by turning on and off a switching element built therein according to a selection signal, the gain switching circuit connected across an input and an output of the amplifier circuit; and a current switching circuit which changes a magnitude of an output current of the amplifier circuit in synchronization with turning on or off the switching element.

According to the above-mentioned construction, in converting the photocurrent of the photodiode into a voltage and amplifying the voltage, the gain switching circuit operates according to the turning-on or turning-off of the switching element based on the selection signal to change the gain of the amplifier circuit. In synchronization with the above-mentioned operation, the magnitude of the output current of the amplifier circuit is changed by the current switching circuit.

Thus the output current of the amplifier circuit is prevented from being excessively increased in, for example, stabilizing the operation of the switching element by supplying a great current to the switching element of the gain switching circuit.

Also, the current switching circuit is a shunt circuit which has its one terminal connected to an output terminal of the amplifier circuit and includes a second switching element, and the selection signal is input to a control terminal of the second switching element.

According to the above-mentioned construction, the selection signal that is supplied to the switching element of the gain switching circuit to change the gain of the amplifier circuit is input to the control terminal of the second switching element of the shunt circuit, or the current switching circuit. Then the second switching element is turned on in synchronization with, for example, the switching element to shunt the output current of the amplifier circuit into the shunt circuit.

Thus based on the selection signal, the output current of the amplifier circuit is prevented from being excessively increased in turning on the switching element.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The following describes in detail light-receiving and amplifying devices of the present invention based on several embodiments thereof.

First Embodiment

Figure 1:
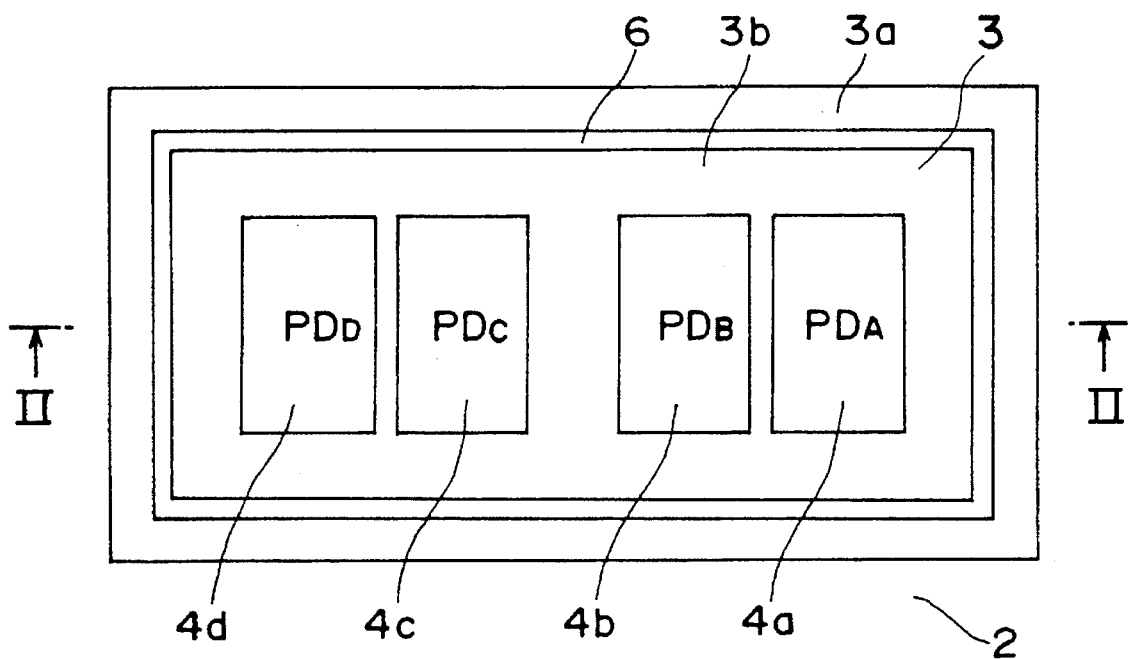
FIG. 1 is a diagram showing the structure of a conventional photodiode.
Figure 2:
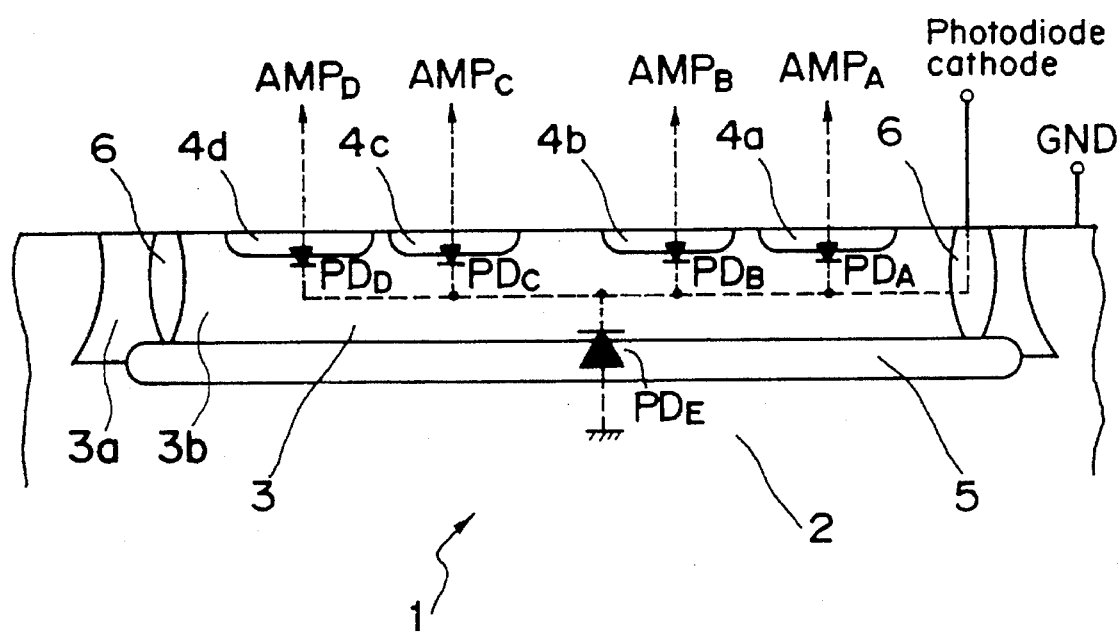
FIG. 2 is a sectional view of the photodiode taken along the line II—II in FIG. 1.
Figure 3:
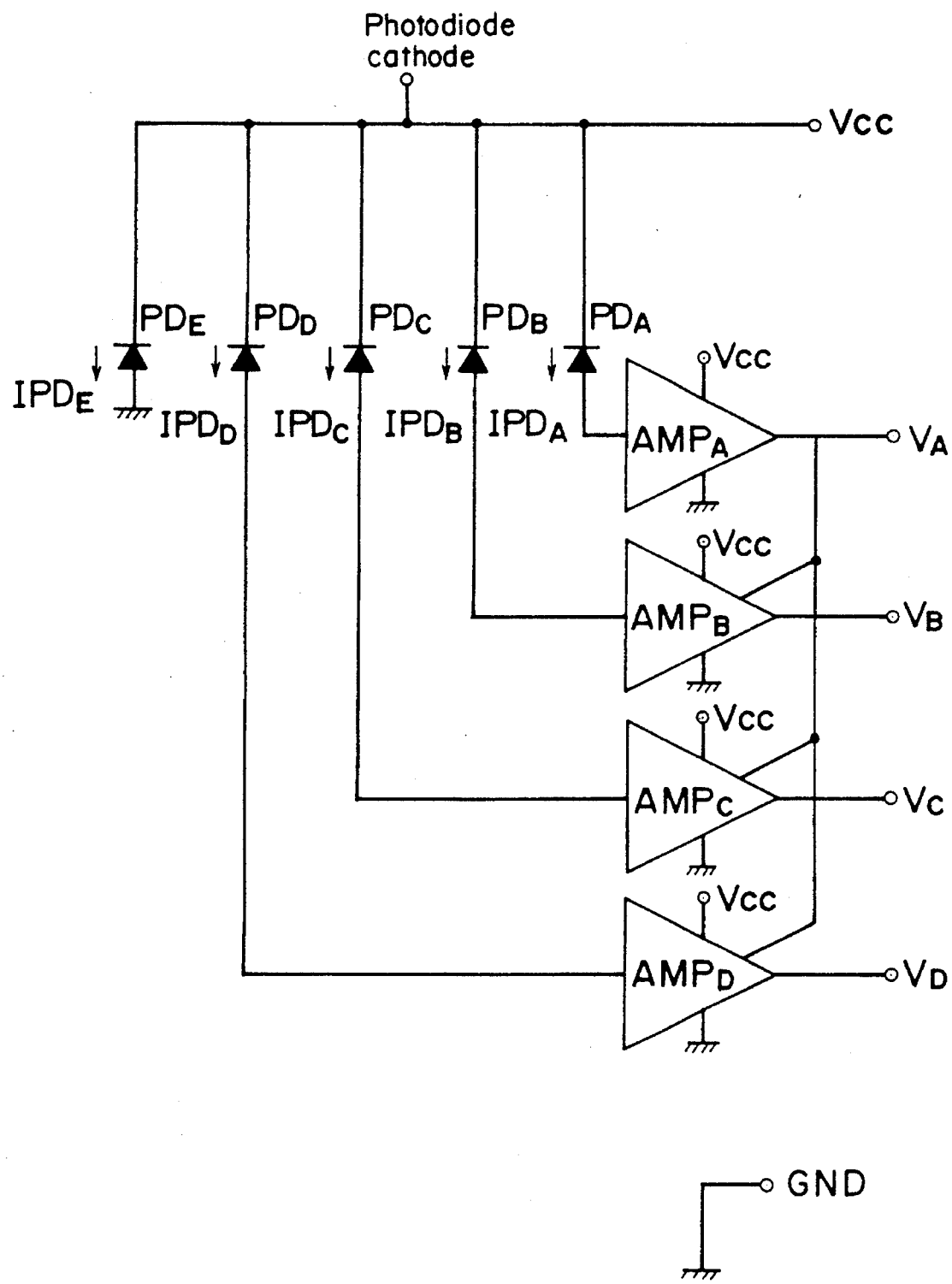
FIG. 3 is an equivalent circuit diagram of a conventional light-receiving and amplifying device.
Figure 4:
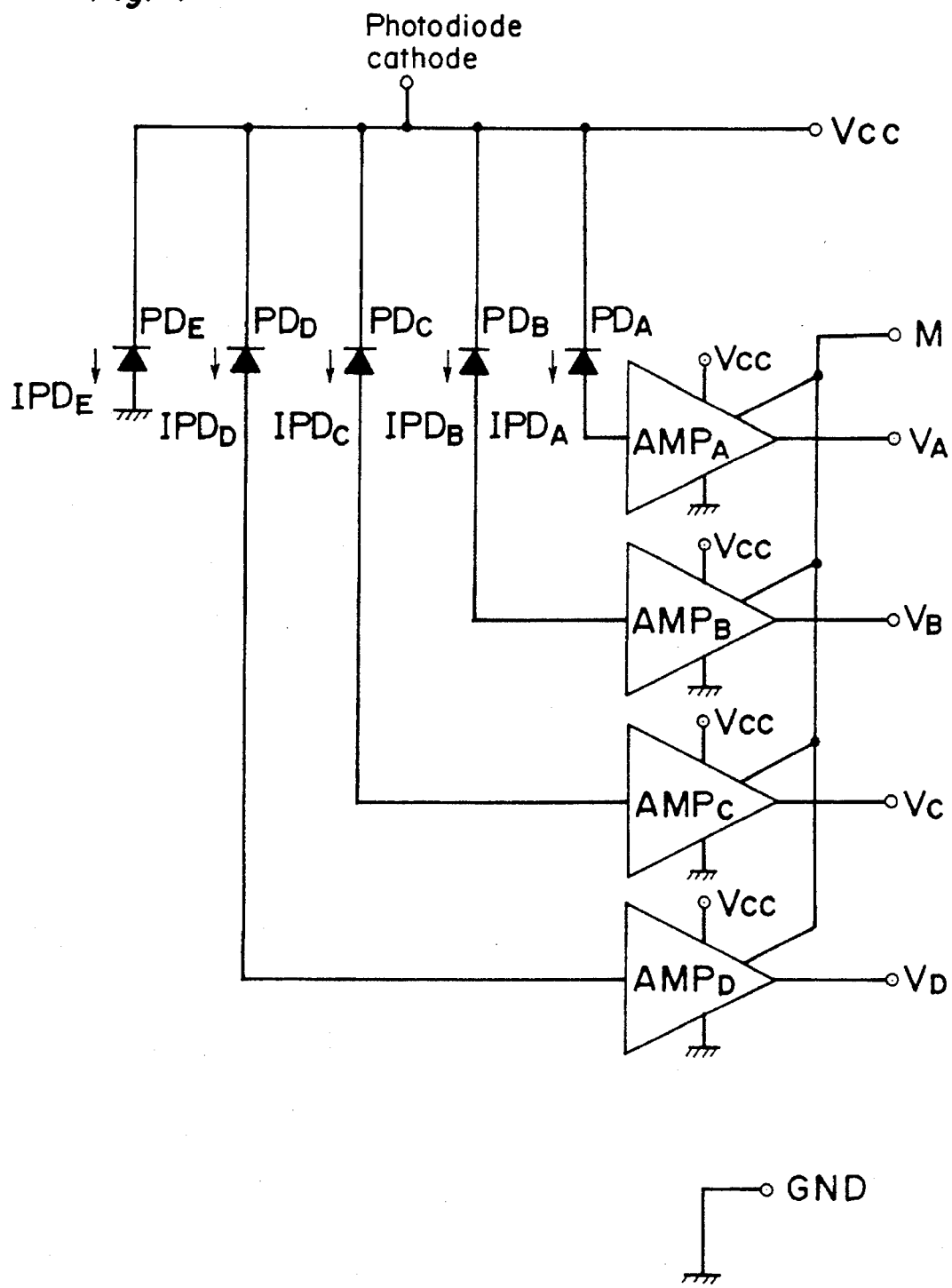
FIG. 4 is an equivalent circuit diagram of a light-receiving and amplifying device in accordance with a first embodiment of the present invention.

FIG. 4 shows an equivalent circuit diagram of a light-receiving and amplifying device in accordance with a first embodiment of the present invention, where cathodes of photodiodes $PD_A$, $PD_B$, $PD_C$, and $PD_D$ are connected to a power source $V_{CC}$, and anodes of the photodiodes $PD_A$, $PD_B$, $PD_C$, and $PD_D$ are connected respectively to inputs of amplifiers $AMP_A$, $AMP_B$, $AMP_C$, and $AMP_D$. To the amplifiers $AMP_A$ through $AMP_D$ is input a selection signal M for changing the gain of each of the amplifiers. It should be noted that a parasitic photodiode $PD_E$ is connected in between the power source VcC and the ground GND. The parasitic photodiode $PD_E$ has its cathode connected to the power source $V_{CC}$, and has its anode connected to the ground GND. When the photodiodes $PD_A$ through $PD_D$ receive incident light, photocurrents $IPD_A$, $IPD_B$, $IPD_C$, and $IPD_D$ flow through the photodiodes. Then the amplifiers $AMP_A$ through $AMP_D$ convert the photocurrents $IPD_A$ through $IPD_D$ into voltages and amplify the voltages to form voltage outputs $V_A$, $V_B$, $V_C$, and $V_D$. The parasitic photodiode $PD_E$ also receives incident light, and a photocurrent $IPD_E$ flows through the photodiode.

Figure 5:
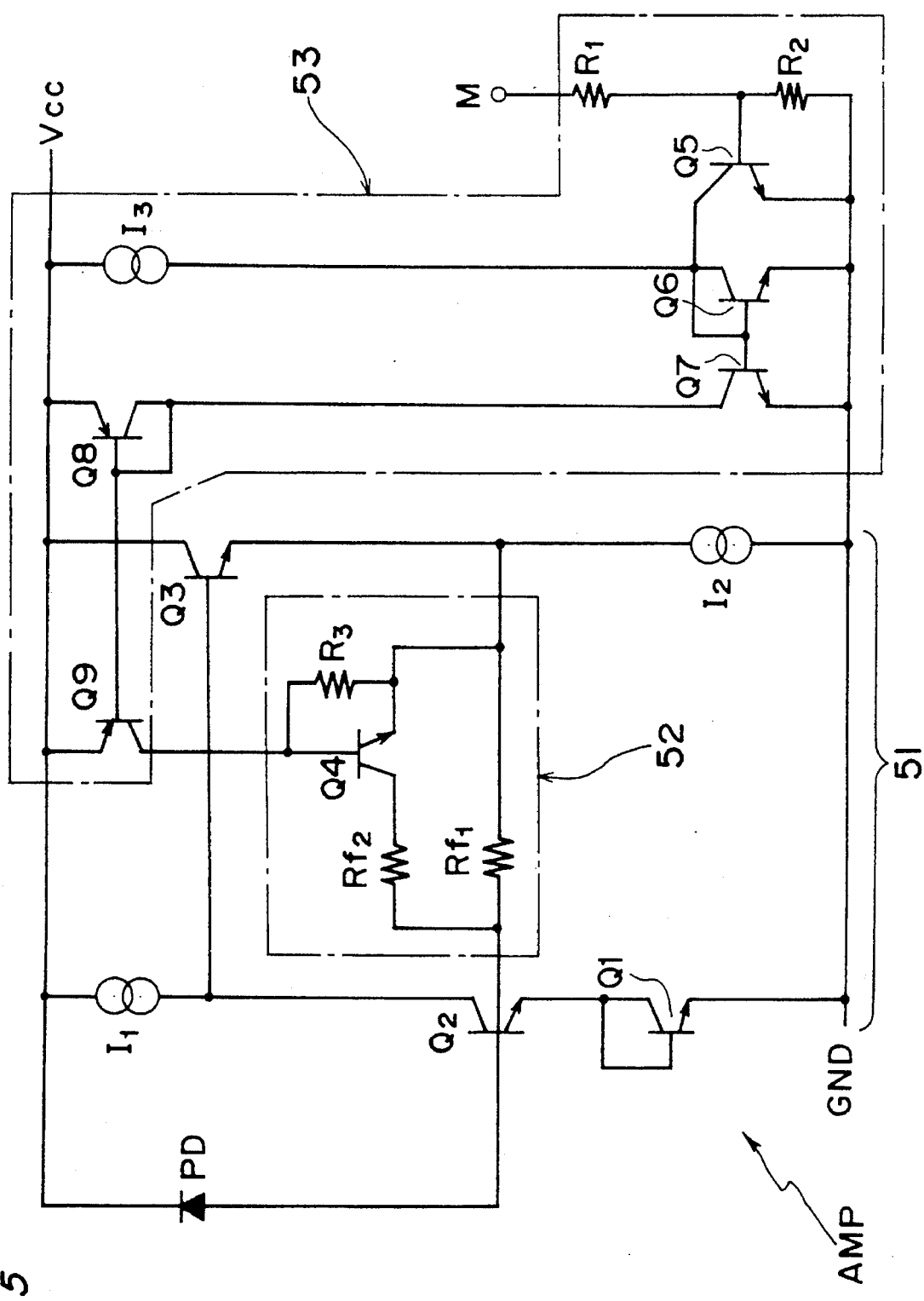
FIG. 5 is a circuit diagram of the light-receiving and amplifying device shown in FIG. 4.

FIG. 5 shows a circuit diagram of a set of photodiode PD and an amplifier AMP in the light-receiving and amplifying device. There are shown a photodiode PD, an amplifier circuit 51 which has its input connected to the anode of the photodiode PD and operates to convert a photocurrent from the photodiode PD into a voltage and amplify the voltage to output an amplified signal; a gain switching circuit 52 which is a feedback circuit connected across the input and the output of the amplifier circuit 51, and a selector circuit 53 which receives an external selection signal M to control the gain switching circuit 52. The amplifier circuit 51, the gain switching circuit 52, and the selector circuit 53 constitute the amplifier AMP. The cathode of the photodiode PD is connected to the power source $V_{CC}$.

The amplifier circuit 51 is composed of an NPN transistor $Q_2$ which has its input terminal of the base connected to the anode of the photodiode PD and has its collector connected to the power source $V_{CC}$ via a constant-current source $I_1$, an NPN transistor $Q_1$ which has its collector connected to the emitter of the NPN transistor $Q_2$, has its emitter connected to the ground GND, and has its collector and base connected to each other to operate as a diode, and an NPN transistor $Q_3$ which has its base connected to the collector of the NPN transistor $Q_2$, has its collector connected to the power source $V_{CC}$, and has its emitter connected to the ground GND via a constant-current source $I_2$ which serves as a load. The NPN transistor $Q_3$ forms an emitter-follower circuit to output a voltage from the emitter of the NPN transistor $Q_3$. The constant-current source $I_1$ flows a current from the power source $V_{CC}$ to the NPN transistor $Q_2$, while the constant-current source $I_2$ flows a current from the NPN transistor $Q_3$ to the ground GND.

The gain switching circuit 52 is composed of a resistor $Rf_1$ connected across the base of the NPN transistor $Q_2$ and the emitter of the NPN transistor $Q_3$, a resistor $Rf_2$ and an NPN transistor $Q_4$ connected in series from the side of the NPN transistor $Q_2$ across the base of the NPN transistor $Q_2$ and the emitter of the NPN transistor $Q_3$, and a resistor $R_3$ connected across the base and the emitter of the NPN transistor $Q_4$. The NPN transistor $Q_4$ has its collector connected to one terminal of the resistor $Rf_2$ and has its emitter connected to the emitter of the NPN transistor $Q_3$. The resistor $R_3$ operates to reduce the switching time of the NPN transistor $Q_4$.

The selector circuit 53 is composed of a constant-current source $I_3$ which has its one terminal connected to the power source $V_{CC}$, an NPN transistor $Q_6$ which has its collector connected to the other terminal of the constant-current source $I_3$, has its emitter connected to the ground GND, and has its base and collector connected to each other, an NPN transistor $Q_7$ which has its base together connected to the base of the NPN transistor $Q_6$ and has its emitter connected to the ground GND, a PNP transistor $Q_8$ which has its collector connected to the collector of the NPN transistor $Q_7$, has its emitter connected to the power source $V_{CC}$, and has its base and collector connected to each other, a PNP transistor $Q_9$ which has its base connected with the base of the PNP transistor $Q_8$ and has its emitter connected to the power source $V_{CC}$, and an NPN transistor $Q_5$ which has its collector connected to the collector of the transistor $Q_6$ and has its emitter connected to the ground GND. The pair of the NPN transistors $Q_6$ and $Q_7$ and the pair of the PNP transistors $Q_8$ and $Q_9$ form current mirror circuits respectively. A selection signal M is input to the base of the NPN transistor $Q_5$ via a resistor $R_1$, and the base is connected to the ground GND via a resistor $R_2$. The collector of the PNP transistor $Q_9$ of the selector circuit 53 is connected to the control input terminal of base of the NPN transistor $Q_4$ of the gain switching circuit 52.

When a photocurrent flows through the photodiode PD from the power source $V_{CC}$ to the NPN transistor $Q_2$ in the light-receiving and amplifying device having the above-mentioned construction, a part of the photocurrent flows through the base of the NPN transistor $Q_2$, and the remaining part of the current flows through the gain switching circuit 52 composed of the resistor $Rf_1$, resistor $Rf_2$, and NPN transistor $Q_4$. Therefore, a part of the current from the constant-current source $I_1$ flow to the ground GND via the NPN transistor $Q_2$ and NPN transistor $Q_1$, while the remaining part of the current flows through the base of the NPN transistor $Q_3$. Then a specified current determined by the constant-current source $I_2$ flows from the power source $V_{CC}$ to the ground GND via the NPN transistor $Q_3$ and constant-current source $I_2$. Thus the amplifier AMP converts the photocurrent into a voltage and amplifies the voltage based on a gain set up by the gain switching circuit 52 to output a voltage output from the emitter of the NPN transistor $Q_3$.

When the selection signal M is made to have an H level, a current flows through the base of the NPN transistor $Q_5$ of the selector circuit 53 via the resistor $R_1$, with which the NPN transistor $Q_5$ is turned on to flow a current of the constant-current source $I_3$ to the ground GND via the NPN transistor $Q_5$. Therefore, no current flows through the bases of the NPN transistors $Q_6$ and $Q_7$ constituting the current mirror circuit, which results in turning off the NPN transistors $Q_6$ and $Q_7$. Also no current flows through the bases of the NPN transistors $Q_8$ and $Q_9$ constituting the current mirror circuit, which results in turning off the NPN transistors $Q_8$ and $Q_9$. Therefore, no current flows through the control terminal of base of the NPN transistor $Q_4$ of the gain switching circuit 52, which results in turning off the NPN transistor $Q_4$. Therefore, a feedback resistance of the gain switching circuit 52 is achieved by the resistor $Rf_1$ to make an equivalent gain resistance of the amplifier AMP be "$Rf_1$."

When the selection signal M is made to have an L level, the NPN transistor $Q_5$ of the selector circuit 53 is turned off. Therefore, the current from the constant-current source $I_3$ flows through the current mirror circuit composed of the NPN transistors $Q_6$ and $Q_7$, and a current having approximately the same magnitude as that of the current of the constant-current source $I_3$ flows through the current mirror circuit composed of the PNP transistors $Q_8$ and $Q_9$. Then a current having approximately the same magnitude as that of the current of the constant-current source $I_3$ flows through the base of the NPN transistor $Q_4$, which results in turning on the NPN transistor $Q_4$. Therefore, the feedback resistance of the gain switching circuit 52 becomes a sum $Rf_3$ of the resistor $Rf_1$, the resistor $Rf_2$, and the ON-state resistance of the NPN transistor $Q_4$ to make the equivalent gain resistance of the amplifier AMP be the resistance $Rf_3$.

As described above, the equivalent gain resistance of the amplifier AMP can be changed by means of the selection signal M. For instance, in a pickup for the mini-disc, the resistor $Rf_1$ of the gain switching circuit 52 is set up at a value as great as possible within a range in which the amplifier circuit 51 is not saturated at a small quantity of light incident on the photodiode PD in the stage of reading from the magneto-optic disc. Meanwhile, the resistance $Rf_3$ of the gain switching circuit 52 is set up at a small value so that the amplifier circuit 51 is not saturated at a great quantity of light incident on the photodiode PD in the stage of writing onto the magneto-optic disc. Thus the selection signal M is controlled according to the condition of the quantity of light incident on the photodiode PD to change over between the feedback resistors of the gain switching circuit 52, the amplifier AMP can be prevented from being saturated over a wide range in quantity of light incident on the photodiode PD while allowing the signal-to-noise ratio to be increased.

Although a set of the resistor $Rf_2$ and the NPN transistor $Q_4$ which serves as the switching element is employed in the gain switching circuit 52 in the aforementioned first embodiment, two or more sets of resistors and switching elements may be employed.

Although the NPN transistor $Q_4$ is employed as the switching element in the aforementioned first embodiment, it is of course permitted to employ a CMOS (Complementary Metal Oxide Semiconductor) analog switch or a switching element equivalent to the above-mentioned element.

As is apparent from the above description, the light-receiving and amplifying device of the first embodiment converts the photocurrent from the photodiode into a voltage and amplifies the voltage while changing over between two or more gain levels of the light-receiving and amplifying device by means of the gain switching circuit.

Therefore, according to the light-receiving and amplifying device of the first embodiment, the amplifier circuit is prevented from being saturated by reducing the gain when the photocurrent of the photodiode is great, while the signal-to-noise ratio can be increased by increasing the gain when the photocurrent of the photodiode is small. With the above-mentioned arrangement, there can be obtained a light-receiving and amplifying device which stably operates at a high signal-to-noise ratio without saturating its amplifier circuit over a wide range in quantity of incident light.

In the light-receiving and amplifying device of the first embodiment, the gain switching circuit includes a resistor and a switching element connected in series across the input and the output of the amplifier circuit, and an external selection signal is input to the control terminal of the switching element to change the gain of the light-receiving and amplifying device.

Therefore, according to the light-receiving and amplifying device of the first embodiment, the gain switching circuit can change the gain of the light-receiving and amplifying device by turning on and off the switching element by means of the external selection signal based on the switching element and the resistor connected in series across the input and the output of the amplifier circuit. Thus by setting up the resistance of the gain switching circuit according to the quantity of light incident on the photodiode, the amplifier circuit is prevented from being saturated by reducing the gain when the photocurrent is great, while the signal-to-noise ratio S/N can be increased by increasing the gain when the photocurrent is small. With the above-mentioned arrangement, there can be obtained a light-receiving and amplifying device which stably operates at a high signal-to-noise ratio S/N without saturating its amplifier circuit over a wide range in quantity of incident light.

Second Embodiment

Figure 6:
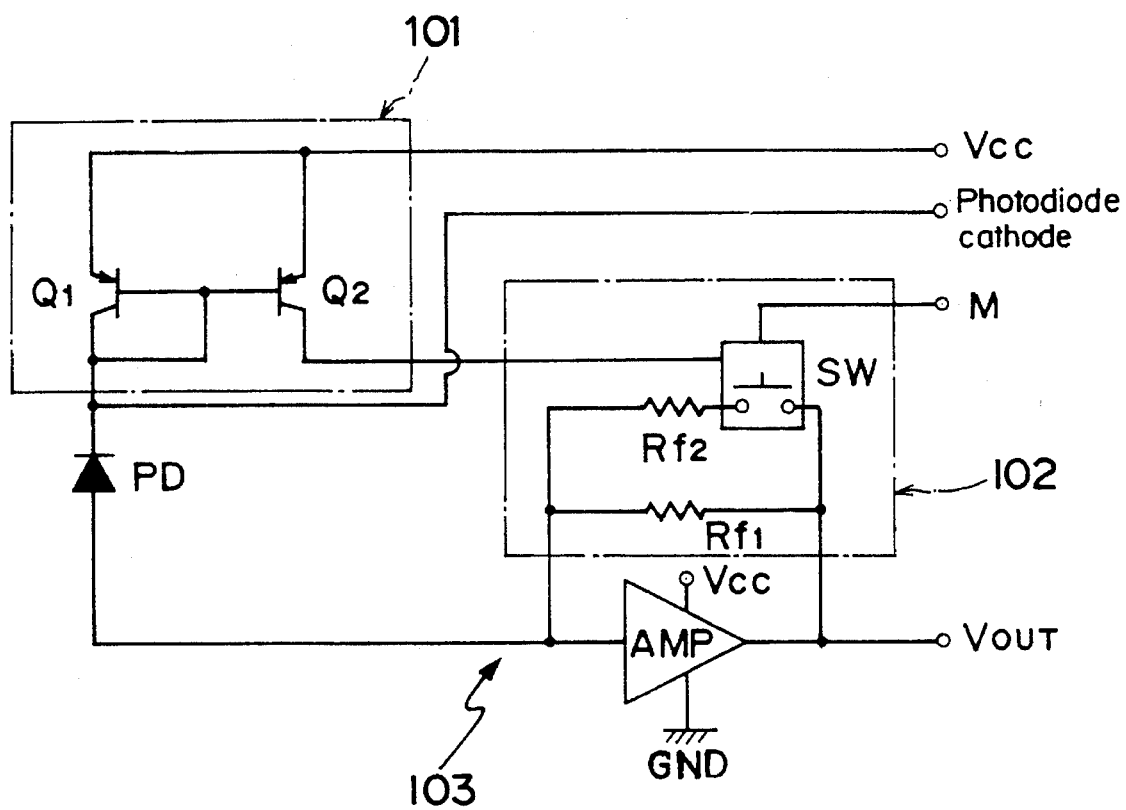
FIG. 6 is an equivalent circuit diagram of a light-receiving and amplifying device in accordance with a second embodiment of the present invention.

FIG. 6 shows an equivalent circuit diagram of a light-receiving and amplifying device in accordance with a second embodiment of the present invention. There are shown a photodiode PD, an amplifier circuit AMP which has its input connected to an anode of the photodiode PD and operates to convert a photocurrent of the photodiode PD into a voltage and amplify the voltage to form an output signal $V_{OUT}$, a current mirror circuit 101 which outputs a control signal of a current having the same magnitude as that of the photocurrent and which is connected across a power source $V_{CC}$ and the cathode of the photodiode PD, and a gain switching circuit 102 which is a feedback circuit connected across the input and the output of the amplifier circuit AMP. The amplifier circuit AMP and the gain changeover circuit 102 constitute an amplifier 103. The cathode of the photodiode PD is led to the outside thereof.

The current mirror circuit 101 is composed of PNP transistors $Q_1$ and $Q_2$ which have their emitters connected to the power source $V_{CC}$ and has their bases connected to each other. The base and collector of the PNP transistor $Q_1$ are connected to each other, and the collector is connected to the cathode of the photodiode PD. The collector of the PNP transistor $Q_2$ is connected to a control terminal (not shown) of the gain switching circuit 102.

The gain switching circuit 102 is composed of a resistor $Rf_1$, a resistor $Rf_2$, and a switch SW, where the resistor $Rf_1$ is connected across the input and the output of the amplifier circuit AMP, and the resistor $Rf_2$ and the switch SW connected in series are connected across the input and the output of the amplifier circuit AMP. Thus the amplifier 103 composed of the amplifier circuit AMP and the gain switching circuit 102 converts the photocurrent from the photodiode PD into a voltage and amplifies the voltage based on a gain set up by the gain switching circuit 102 to form an output signal $V_{OUT}$.

Figure 7:
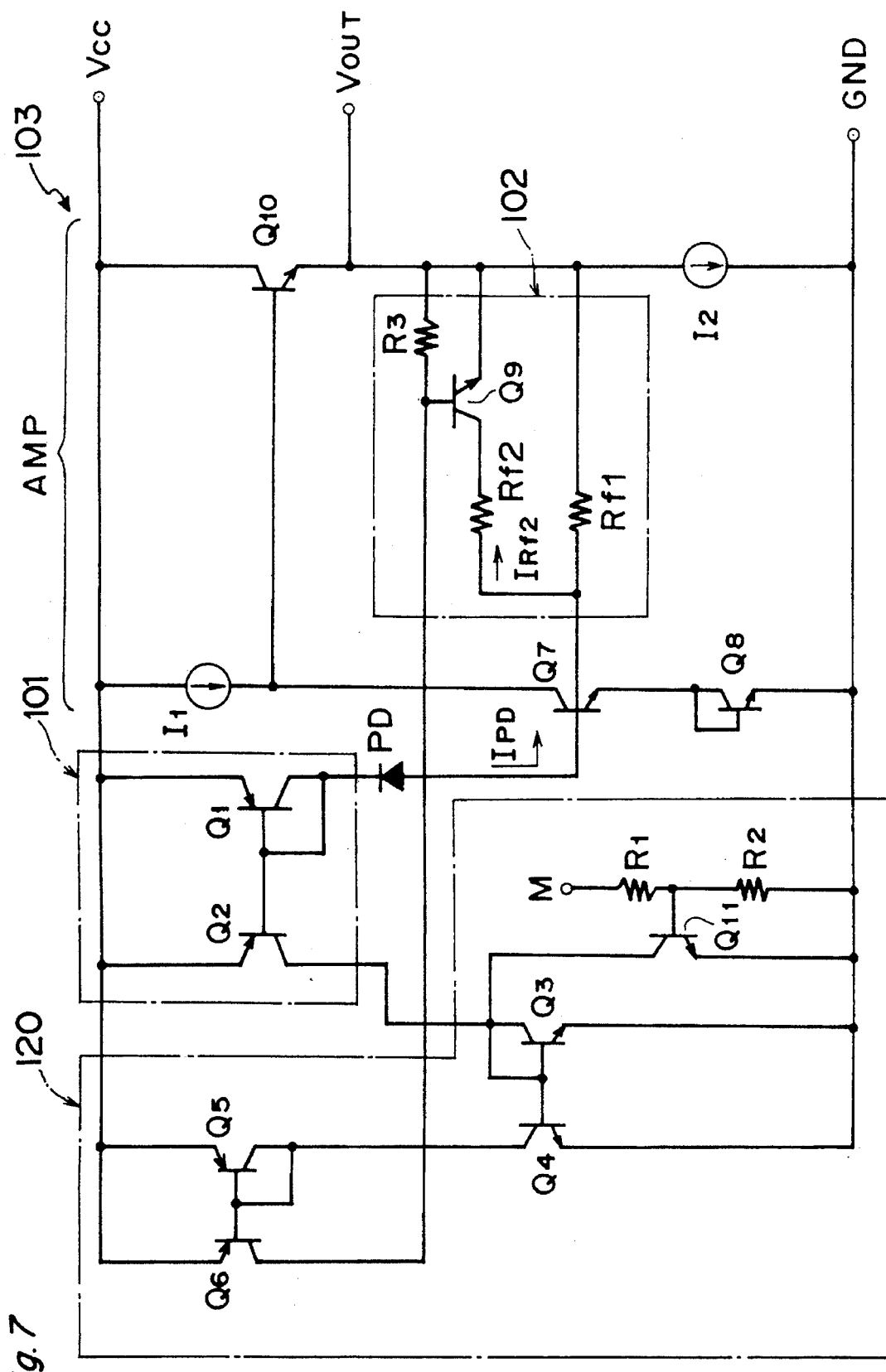
FIG. 7 is a circuit diagram of the light-receiving and amplifying device shown in FIG. 6.

FIG. 7 is a circuit diagram of the light-receiving and amplifying device of the second embodiment, where the same components as those in FIG. 6 are denoted by the same reference numerals. There are shown the photodiode PD, the amplifier circuit AMP of which input is connected to the anode of the photodiode PD, the current mirror circuit 101 connected across the power source $V_{CC}$ and the cathode of the photodiode PD, the gain switching circuit 102, the amplifier 103 composed of the amplifier circuit AMP and the gain switching circuit 102, and a selector circuit 120 which receives a control signal from the current mirror circuit 101 and an external selection signal M to control the gain switching circuit 102. It should be noted that the lead extending from the cathode of the photodiode PD is omitted.

The amplifier circuit AMP, which receives an input from the anode of the photodiode PD connected to the base of an NPN transistor $Q_7$, is composed of the NPN transistor $Q_7$ which has its collector connected to a power source $V_{CC}$ via a constant-current source $I_1$, an NPN transistor $Q_8$ which has its collector connected to the emitter of the NPN transistor $Q_7$, has its collector and the base connected to each other, and has its emitter connected to the ground GND to serve as a diode, and an NPN transistor $Q_{10}$ which has its base connected to the collector of the NPN transistor $Q_7$, has its collector connected to the power source $V_{CC}$ and has its emitter connected to the ground GND via a constant-current source $I_2$ which serves as a load. The NPN transistor $Q_{10}$ constitutes an emitter-follower circuit and outputs an output signal $V_{OUT}$ from the emitter of the NPN transistor $Q_{10}$. The constant-current source $I_1$ flows a current from the power source $V_{CC}$ to the NPN transistor $Q_7$, while the constant-current source $I_2$ flows a current from the NPN transistor $Q_{10}$ to the ground GND.

The gain switching circuit 102 is composed of a resistor $Rf_1$ connected across the base of the NPN transistor $Q_7$ and the emitter of the NPN transistor $Q_{10}$, a resistor $Rf_2$ and an NPN transistor $Q_9$ connected in series from the base of the NPN transistor $Q_7$ across the base of the NPN transistor $Q_7$ and the emitter of the NPN transistor $Q_{10}$, and a resistor $R_3$ connected across the base and the emitter of the NPN transistor $Q_9$. The collector of the NPN transistor $Q_9$ is connected to one terminal of the resistor $Rf_2$, and the emitter of the NPN transistor $Q_9$ is connected to the emitter of the NPN transistor $Q_{10}$. The resistor $R_3$ operates to reduce the switching time of the NPN transistor $Q_9$.

The selector circuit 120 is comprised of: a current mirror circuit composed of an NPN transistor $Q_3$ which has its base and collector connected to each other and an NPN transistor $Q_4$ which has its base connected to the base of the NPN transistor $Q_3$, where the emitters of the NPN transistors $Q_3$ and $Q_4$ are connected to the ground GND; a current mirror circuit composed of a PNP transistor $Q_5$ which has its collector connected to the collector of the NPN transistor $Q_4$ and has its base and collector connected to each other and a PNP transistor $Q_6$ which has its base connected to the base of the PNP transistor $Q_5$, where the emitters of the PNP transistors $Q_5$ and $Q_6$ are connected to the power source $V_{CC}$; and an NPN transistor $Q_{11}$ which has its collector connected to the collector of the NPN transistor $Q_3$. The emitter of the NPN transistor $Q_{11}$ is connected to the ground GND, while a selection signal M is input to the base of the NPN transistor $Q_{11}$ via a resistor $R_1$ with the base connected to the ground GND via a resistor $R_2$. The collector of the NPN transistor $Q_3$ of the selector circuit 120 is connected to the collector of the PNP transistor $Q_2$ of the current mirror circuit 101, and the collector of the PNP transistor $Q_6$ of the selector circuit 1200 is connected to the control terminal of base of the NPN transistor $Q_9$ of the gain changeover circuit 102.

When the light-receiving and amplifying device having the above-mentioned construction is employed in, for example, a pickup of a mini-disc player, a photocurrent $I_{PD}$ flows from the power source $V_{CC}$ to the cathode of the photodiode PD via the PNP transistor $Q_1$ of the current mirror circuit 101 and further flows from the anode of the photodiode PD to the base of the NPN transistor $Q_7$ in the reproduction stage. Meanwhile, a control signal of a current having approximately the same magnitude as that of the photocurrent IpD is output from the collector of the PNP transistor $Q_2$ of the current mirror circuit 101. Then the selection signal M is made to have an H level to flow a current through the base of the NPN transistor $Q_{11}$ via the resistor $R_1$ to turn on the NPN transistor $Q_{11}$. With the above-mentioned operation, the current of the control signal flows to the ground GND via the NPN transistor $Q_{11}$, while no current flows through the current mirror circuit composed of the NPN transistors $Q_3$ and $Q_4$. Also no current flows through the current mirror circuit composed of the PNP transistors $Q_5$ and $Q_6$. Therefore, no current flows through the control terminal of base of the NPN transistor $Q_9$, which results in turning off the NPN transistor $Q_9$. Thus a part of the current from the constant-current source $I_1$ flows to the ground GND via the NPN transistor $Q_7$ and the NPN transistor $Q_8$, while the remaining part of the current flows through the base of the NPN transistor $Q_{10}$. Consequently, a specified current determined by the constant-current source $I_2$ flows from the power source $V_{CC}$ to the ground GND via the NPN transistor $Q_{10}$ and the constant-current source $I_2$. It should be noted that a part of the photocurrent $I_{PD}$ of the photodiode PD flows to the ground GND via the resistor $Rf_1$ and the constant-current source $I_2$. Therefore, an output signal $V_{OUT}$ which has been amplified approximately in proportion to the photocurrent $I_{PD}$ based on the specified gain determined by the resistor $Rf_1$ is output from the emitter of the NPN transistor $Q_{10}$.

In the recording stage, a photocurrent $I_{PD}$ greater than the photocurrent in the reproduction stage flows from the power source $V_{CC}$ to the cathode of the photodiode PD via the PNP transistor $Q_1$ of the current mirror circuit 101, and further flows through the anode of the photodiode PD to the base of the NPN transistor $Q_7$. Meanwhile, a control signal of a current having approximately the same magnitude as that of the photocurrent $I_{PD}$ is output from the collector of the PNP transistor $Q_2$ of the current mirror circuit 101. Then the selection signal M is made to have an L level to turn off the NPN transistor $Q_{11}$. Therefore, a current flows through the current mirror circuit composed of the NPN transistors $Q_3$ and $Q_4$, and a current also flows through the current mirror circuit composed of the PNP transistors $Q_5$ and $Q_6$. Therefore, a current flows through the control terminal of base of the NPN transistor $Q_9$ to turn on the NPN transistor $Q_9$. Thus a part of the current from the constant-current source $I_1$ flows to the ground GND via the NPN transistor $Q_7$ and the NPN transistor $Q_8$, while the remaining part of the current flows through the base of the NPN transistor $Q_{10}$. Consequently, the specified current determined by the constant-current source $I_2$ flows from the power source $V_{CC}$ to the ground GND via the NPN transistor $Q_{10}$ and the constant-current source $I_2$. Since the NPN transistor $Q_9$ is turned on, a part of the photocurrent $I_{PD}$ of the photodiode PD flows through a synthetic resistance of the resistor $Rf_1$ and the resistor $Rf_2$ connected in parallel, and further flows to the ground GND via the constant-current source $I_2$. Therefore, a voltage which has been amplified approximately in proportion to the photocurrent $I_{PD}$ based on a gain which is smaller than the gain in the reproduction stage and determined by the resistor $Rf_1$ and the resistor $Rf_2$ is output as an output signal $V_{OUT}$ from the emitter of the NPN transistor $Q_{10}$.

In the present case, an overdrive coefficient N of the NPN transistor $Q_9$ can be given by the equation:

$$N=(I_B \times h_{FE})/I_{Rf2} \tag{1}$$

where $I_B$ is the base current of the NPN transistor $Q_9$, $h_{FE}$ is the current amplification factor of the NPN transistor $Q_9$, and $I_{Rf2}$ is the current flowing through the resistor $Rf_2$. Meanwhile, the current $I_{Rf2}$ flowing through the resistor $Rf_2$ can be expressed by the equation:

$$I_{Rf2}=I_{PD} \times Rf_1/(Rf_1+Rf_2) \tag{2}$$

Since the gain in the recording stage is made to be, for example, one tenth of the gain in the reproduction stage, the resistor $Rf_2$ has a resistance value smaller than that of the resistor $Rf_1$. Assuming that the equation (2) is approximated to:

$$I_{Rf2} \approx I_{PD} \tag{3},$$

the overdrive coefficient N of the NPN transistor $Q_9$ can be expressed by the equation:

$$N=(I_B \times h_{FE})/I_{PD} \tag{4}$$

according to Equations (1) and (3). Therefore, when the base current $I_B$ of the NPN transistor $Q_9$ is made approximately equal to the photocurrent $I_{PD}$ in the same manner as in the light-receiving and amplifying device of the aforementioned embodiment, the overdrive coefficient N coincides with the current amplification factor $h_{FE}$ of the NPN transistor $Q_9$. Therefore, the overdrive coefficient N varies depending only on the current amplification factor $h_{FE}$, meaning that the variation reduces.

Thus the current flowing through the base of the NPN transistor $Q_9$ which serves as a switching element of the gain changeover circuit 102 is made to have approximately the same magnitude as that of the photocurrent $I_{PD}$, of the photodiode PD to make the collector current of the NPN transistor $Q_9$ approximately proportional to the base current. With the above-mentioned arrangement, even when the collector current of the NPN transistor $Q_9$ increases or decreases approximately in proportion to the photocurrent $I_{PD}$, the base current of the NPN transistor $Q_9$ increases or decreases in the same manner as the photocurrent $I_{PD}$. In other words, when the photocurrent $I_{PD}$ of the photodiode PD increases, the collector current of the NPN transistor $Q_9$ increases and the base current of the NPN transistor $Q_9$ increases. Therefore, the switching time of the NPN transistor $Q_9$ in the case where the photocurrent $I_{PD}$ is large is made approximately equal to the switching time achieved in the case where the photocurrent $I_{PD}$ is small, i.e., the switching time is reduced. Therefore, the switching time of the NPN transistor $Q_9$ can be made approximately constant and high speed regardless of the change in quantity of light incident on the photodiode PD and the variation of the base current of the NPN transistor $Q_9$. By employing an NPN transistor having a great current amplification factor $h_{FE}$ as the NPN transistor $Q_9$, the switching time can be easily reduced. Therefore, the time required for the switching of the gain switching circuit 102 can be reduced to allow the gain of the light-receiving and amplifying device to be changed at high speed.

Although one switch SW is employed in the gain switching circuit 102 in the second embodiment, two or an arbitrary number of switches may be employed.

Although the switching element is implemented by the NPN transistor $Q_9$ in the second embodiment, a PNP transistor or a switching element having the same switching characteristics may be employed.

As is apparent from the above description, in the light-receiving and amplifying device of the second embodiment, the amplifier circuit amplifies the photocurrent of the photodiode through current-to-voltage conversion, the current mirror circuit outputs a control signal of a current having approximately the same magnitude as that of the photocurrent, the gain switching circuit has at least one set of a resistor and a switching element connected in series across the input and the output of the amplifier circuit, and an external selection signal and the control signal output from the current mirror circuit are input to the control terminal of the switching element.

According to the light-receiving and amplifying device of the second embodiment, the current flowing through the control terminal of the selected switching element of the gain switching circuit is made to have approximately the same magnitude as that of the photocurrent of the photodiode. Meanwhile, the feedback current flowing through the switching element is approximately proportional to the current through the control terminal of the switching element. Therefore, when the photocurrent from the photodiode increases to increase the feedback current flowing through the switching element, the current of the control signal input to the control terminal increases. Consequently, the switching time of the switching element is made approximately equal to the switching time achieved in the case where the photocurrent is small, i.e., the switching time can be reduced. Therefore, the switching time of the switching element can be made approximately constant and high speed regardless of the change in quantity of light incident on the photodiode and the variation of the current of the control signal flowing through the control terminal of the switching element. Therefore, the time required for the switching of the gain switching circuit can be reduced to allow a light-receiving and amplifying device capable of changing its gain at high speed to be achieved.

Third Embodiment

Figure 8:
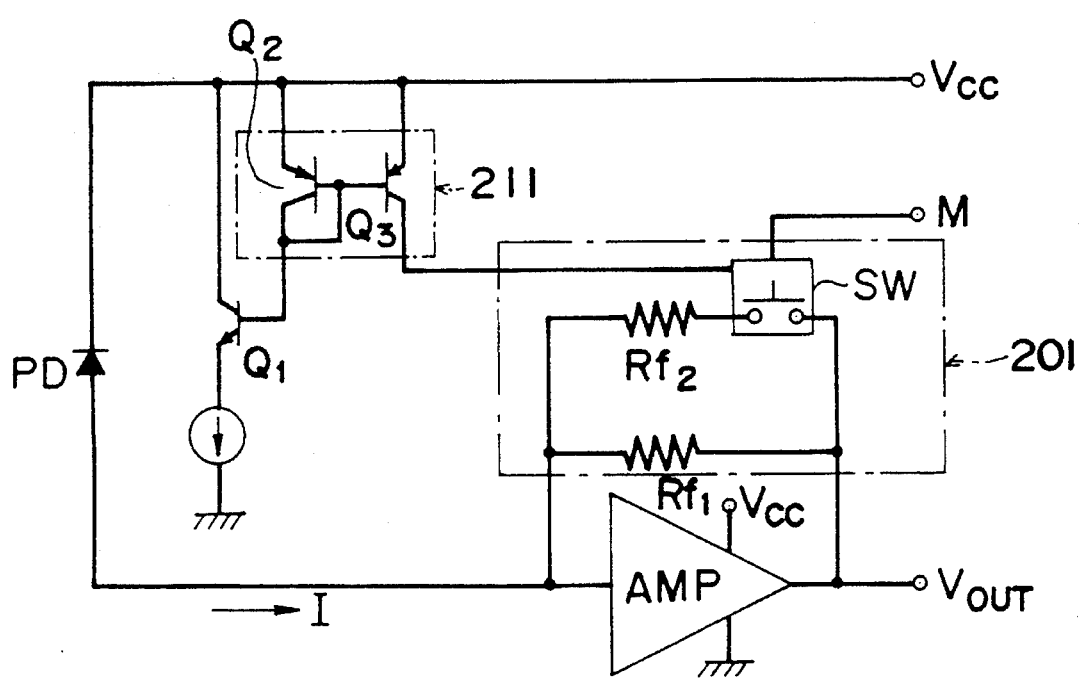
FIG. 8 is an equivalent circuit diagram of a light-receiving and amplifying device in accordance with a third embodiment of the present invention.

FIG. 8 shows an equivalent circuit diagram of a light-receiving and amplifying device in accordance with a third embodiment of the present invention. The present light-receiving and amplifying device includes a current mirror circuit 211 in addition to a photodiode PD, an amplifier AMP, and a gain switching circuit 201.

The photodiode PD generates a photocurrent I according to the quantity of incident light received, and flows the generated photocurrent I to an amplifier AMP connected to an anode of the photodiode PD. Then the amplifier AMP converts the photocurrent I into a voltage and amplifies the voltage to form an output signal $V_{OUT}$.

In the above case, the current mirror circuit 211 composed of transistors $Q_2$ and $Q_3$ provided in between a cathode of the photodiode PD and the power source $V_{CC}$ outputs a constant current determined by a current amplification factor $h_{FE}$ to a switch circuit SW of the gain switching circuit 201. Therefore, a transistor constituting the switch circuit SW can change over between gain resistors provided in the gain switching circuit 201 by means of a control signal of a constant current to reduce the response time in changing the gain. Furthermore, as described in detail hereinafter, the transistor constituting the switch circuit SW can execute its switching operation independently of the current amplification factor $h_{FE}$ of the transistor to further reduce the response time in changing the gain.

Figure 9:
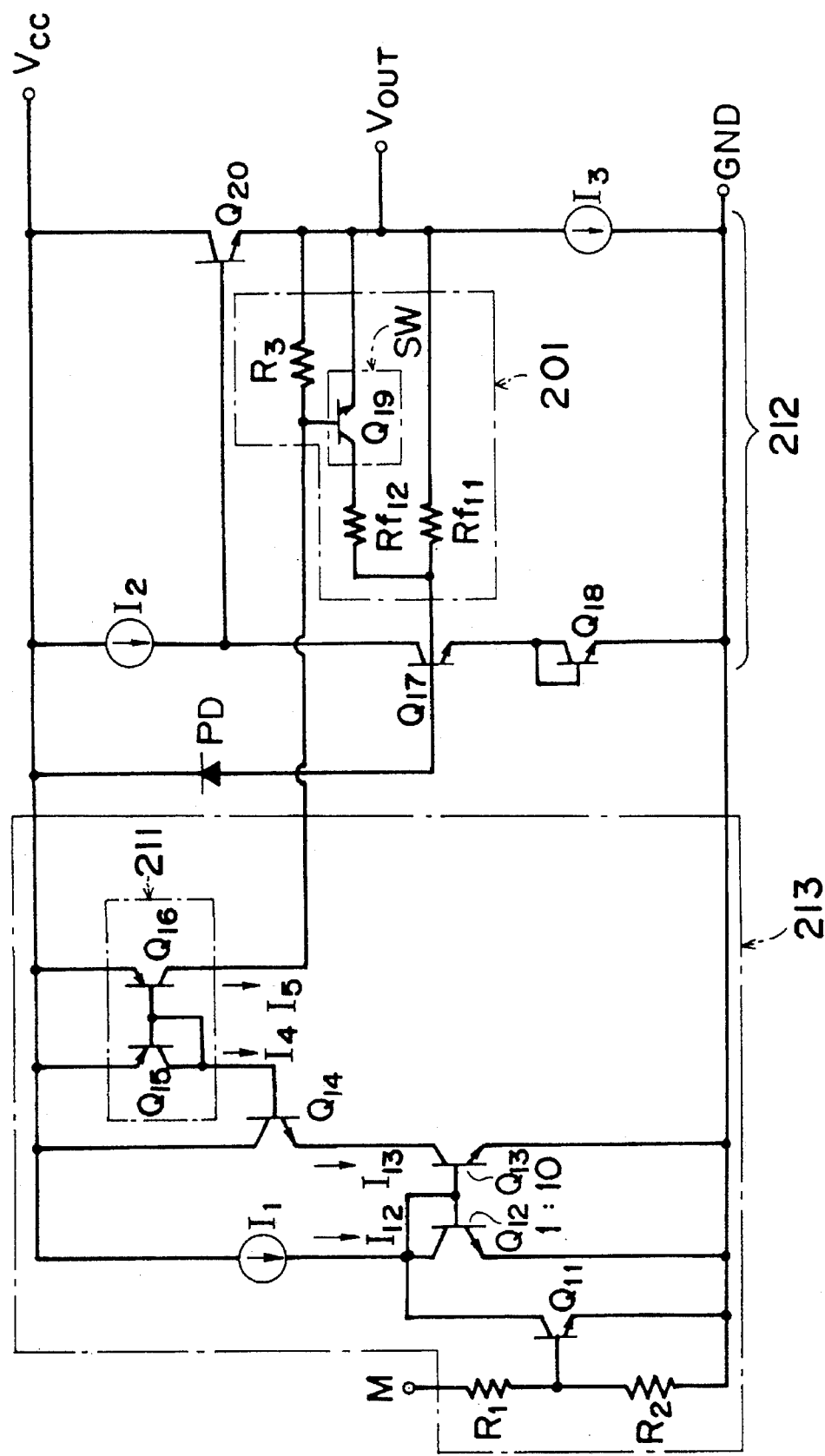
FIG. 9 is a circuit diagram of the light-receiving and amplifying device shown in FIG. 8.

FIG. 9 shows a circuit diagram of the light-receiving and amplifying device shown in FIG. 8. The following describes in detail the light-receiving and amplifying device with reference to FIG. 9.

The present light-receiving and amplifying device is approximately composed of an amplifier circuit 212 which converts a photocurrent from the photodiode PD into a voltage and amplifies the voltage, a gain switching circuit 201 which is a feedback circuit connected across the input and the output of the amplifier circuit 212, and a selector circuit 213 which receives an external input signal M to control the gain switching circuit 201.

The photodiode PD has its anode connected to the base terminal of an NPN transistor $Q_{17}$, i.e., an input terminal of the amplifier circuit 212, and has its cathode connected to the power source $V_{CC}$.

The amplifier circuit 212 is approximately composed of three NPN transistors $Q_{17}$, $Q_{18}$, and $Q_{20}$ and two constant-current sources $I_2$ and $I_3$.

In the present case, the NPN transistor $Q_{17}$ has its base on the input side connected to the anode of the photodiode PD and has its collector connected to the power source $V_{CC}$ via the constant-current source $I_2$. The NPN transistor $Q_{18}$ has its collector connected to the emitter of the NPN transistor $Q_{17}$, has its emitter connected to the ground GND, and has its base connected to its collector to operate as a diode. The NPN transistor $Q_{20}$ has its base connected to the collector of the NPN transistor $Q_{17}$, has its collector connected to the power source $V_{CC}$, and has its emitter connected to the ground GND via the constant-current source $I_3$ which serves as a load.

The NPN transistor $Q_{20}$ constitutes an emitter-follower circuit to output a voltage from its emitter. The constant-current source $I_2$ flows a current from the power source $V_{CC}$ to the NPN transistor $Q_{17}$, while the constant-current source $I_3$ flows a current from the NPN transistor $Q_{20}$ to the ground GND.

The gain switching circuit 201 is composed of a resistor $Rf_1$ connected across the base of the NPN transistor $Q_{17}$ on the input side of the amplifier circuit 212 and the emitter of the NPN transistor $Q_{20}$ on the output side of the amplifier circuit 212, a resistor $Rf_2$ and a NPN transistor $Q_{19}$ connected in series from the side of the NPN transistor $Q_{17}$ across the base of the NPN transistor $Q_{17}$ and the emitter of the NPN transistor $Q_{20}$, and a resistor $R_3$ connected across the base and the emitter of the NPN transistor $Q_{19}$.

The NPN transistor $Q_{19}$ has its collector connected to one terminal of the resistor $Rf_2$ and has its emitter connected to the emitter of the NPN transistor $Q_{20}$ to constitute a switch circuit SW of the gain switching circuit 201. The resistor $R_3$ operates to reduce the switching time of the NPN transistor $Q_{19}$.

The selector circuit 213 is approximately composed of a constant-current source $I_1$ which has its one terminal connected to the power source $V_{CC}$, NPN transistors $Q_{11}$ through $Q_{14}$, and PNP transistors $Q_{15}$ and $Q_{16}$.

The NPN transistor $Q_{12}$ has its collector connected to the other terminal of the constant-current source $I_1$, has its emitter connected to the ground GND, and has its base connected to its collector. The NPN transistor $Q_{13}$ has its base connected to the base of the NPN transistor $Q_{12}$, has its emitter connected to the ground GND, and has its collector connected to the emitter of the NPN transistor $Q_{14}$. The NPN transistor $Q_{13}$ has its emitter area ten times as great as the emitter area of the NPN transistor $Q_{12}$. The NPN transistor $Q_{14}$ has its collector connected to the power source $V_{CC}$, and has its base connected to the collector of the PNP transistor $Q_{15}$.

The PNP transistor $Q_{15}$ has its emitter connected to the power source $V_{CC}$, has its base connected to its collector. The PNP transistor $Q_{16}$ has its emitter connected to the power source $V_{CC}$, has its collector connected to the base of the NPN transistor $Q_{19}$, and has its base connected to the base of the PNP transistor $Q_{15}$. The NPN transistor $Q_{11}$ has its collector connected to the collector of the NPN transistor $Q_{12}$, has its emitter connected to the ground GND, and has its base connected to an input terminal of the selection signal M via a resistor $R_1$ with its base connected to the ground GND via a resistor $R_2$.

The PNP transistors $Q_{15}$ and $Q_{16}$ constitute a current mirror circuit 211. The collector of the PNP transistor $Q_{16}$ of the selector circuit 213 is connected to a control input terminal of base of the NPN transistor $Q_{19}$ which serves as the switch circuit SW in the gain switching circuit 201.

When a photocurrent flows through the photodiode PD from the power source $V_{CC}$ to the NPN transistor $Q_{17}$ in the light-receiving and amplifying device having the above-mentioned construction, a part of the photocurrent flows into the base of the NPN transistor $Q_{17}$, while the remaining part of the current flows into the gain switching circuit 201. Therefore, a part of the current from the constant-current source $I_2$ flows to the ground GND via the NPN transistor $Q_{17}$ and the NPN transistor $Q_{18}$, while the remaining part of the current flows into the base of the NPN transistor $Q_{20}$. Then a specified current determined by the constant-current source $I_3$ flows from the power source $V_{CC}$ to the ground GND via the NPN transistor $Q_{20}$ and the constant-current source $I_3$.

Thus the amplifier circuit 212 converts the photocurrent into a voltage and amplifies the voltage based on the gain set up by the gain switching circuit 201 to output a voltage from the emitter of the NPN transistor $Q_{20}$.

When the selection signal M input to the input terminal of the selector circuit 213 has an H level, a current flows into the base of the NPN transistor $Q_{11}$ via the resistor $R_1$. Consequently, the NPN transistor $Q_{11}$ is turned on to flow a current $I_{12}$ from the constant-current source $I_1$ to the ground GND via the NPN transistor $Q_{11}$. Therefore, no current flows through the bases of the NPN transistors $Q_{12}$ and $Q_{13}$, which results in turning off both the NPN transistors $Q_{12}$ and $Q_{13}$. Therefore, no current flows through the bases of the two PNP transistors $Q_{15}$ and $Q_{16}$ constituting the current mirror circuit 211, which results in turning off both the PNP transistors $Q_{15}$ and $Q_{16}$.

In other words, when the selection signal M has the H level, the NPN transistor $Q_{19}$ of the gain switching circuit 201 is turned off. Therefore, the feedback resistance of the current mirror circuit 201 is achieved by the resistor $Rf_{11}$ to make the equivalent gain resistance of the amplifier AMP be "$Rf_{11}$."

When the selection signal M has an L level, the NPN transistor $Q_{11}$ of the selector circuit 213 is turned off. Therefore, a current from the constant-current source $I_1$ flows into the NPN transistors $Q_{12}$ and $Q_{13}$, while a current flows through the current mirror circuit 211 composed of the PNP transistors $Q_{15}$ and $Q_{16}$. Consequently, a current flows into the base of the NPN transistor $Q_{19}$ of the gain changeover circuit 201 to turn on the NPN transistor $Q_{19}$ constituting the switch circuit SW.

In other words, when the selection signal M has the L level, the feedback resistance of the gain switching circuit 201 is achieved by a synthetic resistance composed of a parallel connection of the sum of the ON-state resistance of the NPN transistor $Q_{19}$ and the resistance of the resistor $Rf_{12}$ with the resistor $Rf_{11}$. Consequently, the equivalent gain resistance of the amplifier AMP coincides with the value "$Rf_3 (<Rf_{11})$" of the synthetic resistance.

In the above case, the base current of the NPN transistor $Q_{19}$ becomes a constant current depending on the current amplification factor $h_{FE}$ of the current mirror circuit 211.

Therefore, the NPN transistor $Q_{19}$ which serves as the switch circuit SW of the gain switching circuit 201 can execute its switching operation at a constant speed by virtue of the stable base current to allow switching of the gain of the amplifier AMP to be executed at high speed.

The overdrive coefficient N of the NPN transistor $Q_{19}$ is given by Equation (1) as follows:

$$N=(I_B \times h_{FE}(Q_{19}))/I_{Rf12} \tag{5}$$

where $I_B$ is the base current of the NPN transistor $Q_{19}$, $h_{FE}(Q_{19})$ is the current amplification factor of the NPN transistor $Q_{19}$, and $I_{Rf12}$ is the current flowing through the resistor $Rf_{12}$.

Meanwhile, the following Equations (6) through (9) hold in FIG. 9.

$$I_1=I_{12} \tag{6}$$

$$I_{13}=10 \cdot I_{12} \tag{7}$$

$$I_4=I_{13}/h_{FE}(Q_{14}) \tag{8}$$

$$I_4=I_5 \tag{9}$$

Therefore, the following Equation (10) hold.

$$\begin{aligned}I_5 &= I_{13}/h_{FE}(Q_{14}) \\ &= 10 \times I_1/h_{FE}(Q_{14}) \\ &= I_B \end{aligned} \tag{10}$$

When Equation (10) is substituted into Equation (5), the following Equation (11) can be derived.

$$N=\{(10 \cdot I_1/h_{FE}(Q_{14})) \times h_{FE}(Q_{19})\}/I_{Rf12} \tag{11}$$

When the transistors $Q_{14}$ and $Q_{19}$ are integrated, the current amplification factor of the transistor $Q_{14}$ becomes approximately equal to the current amplification factor of the transistor $Q_{19}$ to satisfy the following equation:

$$h_{FE}(Q_{14})=h_{FE}(Q_{19}),$$

and Equation (11) can be expressed as:

$$N=10 \cdot I_1 > /I_{Rf12}$$

where $10 \cdot I_1 > I_{Rf12}$.

Therefore, the possible variation of the overdrive coefficient N of the transistor $Q_{19}$ which serves as the switch circuit SW of the gain switching circuit 201 depending on the current amplification factor $h_{FE}$ is eliminated, and the influence of the collector current $I_{Rf12}$ on the overdrive coefficient N can be reduced to allow the response time in the switching operation to be reduced.

As apparent from the above description, in the light-receiving and amplifying device of the third embodiment, a control signal of a constant current relating to the current amplification factor from the current mirror circuit is supplied to the control terminal of the switching element of the gain switching circuit according to the level of the external selection signal. With the above-mentioned arrangement, the switching element can change over the gain of the amplifier circuit by executing a switching operation in a specified time according to the control signal of the constant current.

Therefore, according to the third embodiment, the gain of the amplifier circuit which converts the photocurrent from the photodiode PD into a voltage and amplifies the voltage can be changed at high speed.

Fourth Embodiment

Figure 10:
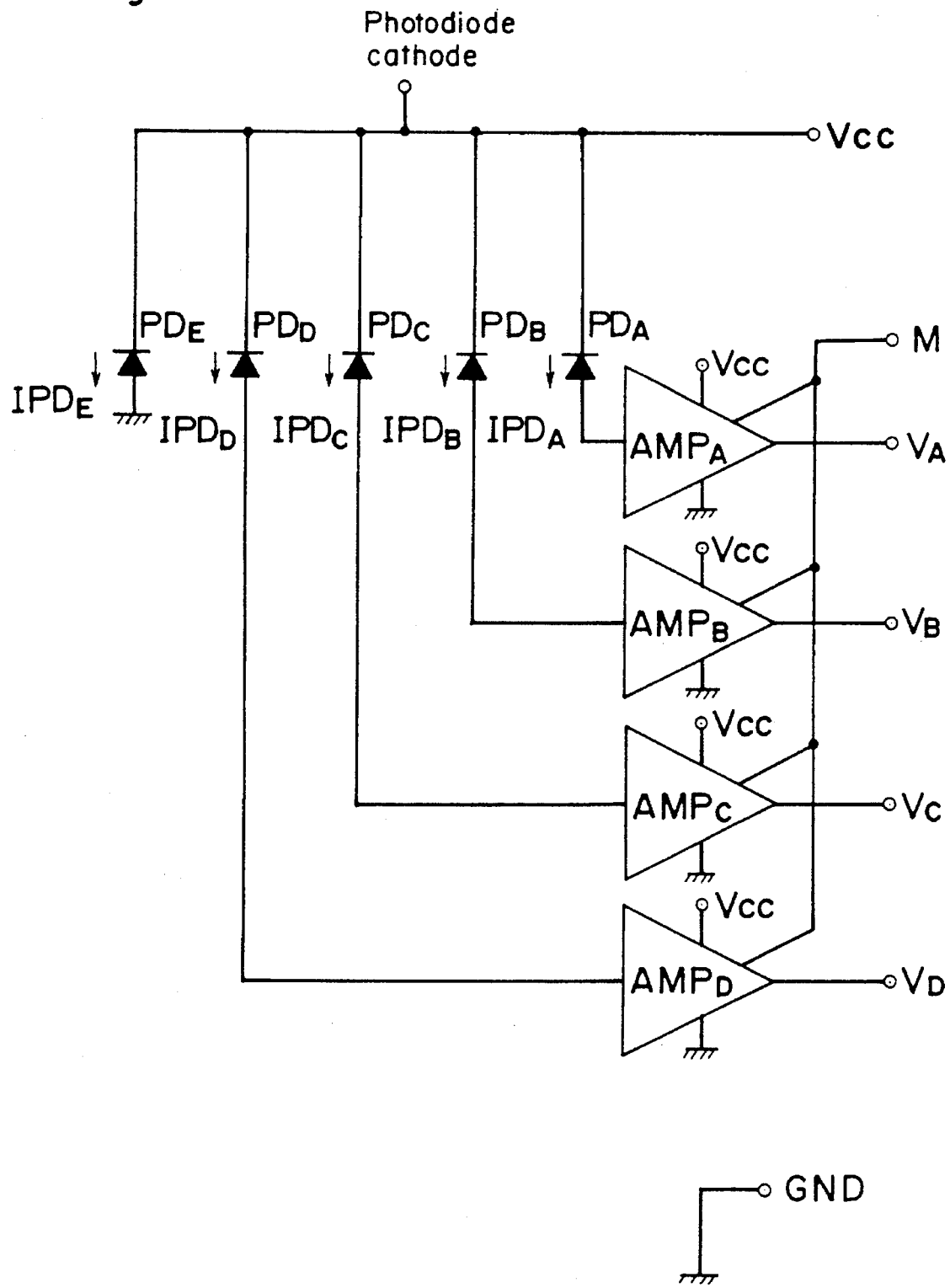
FIG. 10 is an equivalent circuit diagram of a light-receiving and amplifying device in accordance with a fourth embodiment of the present invention.

FIG. 10 is an equivalent circuit diagram of a light-receiving and amplifying device in accordance with a fourth embodiment of the present invention.

In the light-receiving and amplifying device of the fourth embodiment, cathodes of photodiodes $PD_A$, $PD_B$, $PD_C$, and $PD_D$ are connected to a power source $V_{CC}$, anodes of the photodiodes $PD_A$, $PD_B$, $PD_C$, and $PD_D$ are connected respectively to input terminals of amplifiers $AMP_A$, $AMP_B$, $AMP_C$, and $AMP_D$. The amplifiers $AMP_A$ through $AMP_D$ are each provided with an input terminal of a selection signal M for changing the gain of each of the amplifiers. Between the power source $V_{CC}$ and the ground GND is existing a parasitic photodiode $PD_E$ which has its cathode connected to the power source $V_{CC}$ and has its anode connected to the ground GND.

When light is incident on the photodiodes $PD_A$ through $PD_D$, photocurrents $IPD_A$, $IPD_B$, $IPD_C$, and $IPD_D$ flow through the photodiodes $PD_A$ through $PD_D$, respectively. Then the amplifiers $AMP_A$ through $AMP_D$ each convert the input photocurrents $IPD_A$ through $IPD_D$ into a voltage and amplifies the voltage to form output voltages $V_A$, $V_B$, $V_C$, and $V_D$, respectively.

When light is incident on the parasitic photodiode $PD_E$, a photocurrent $IPD_E$ also flows.

Figure 11:
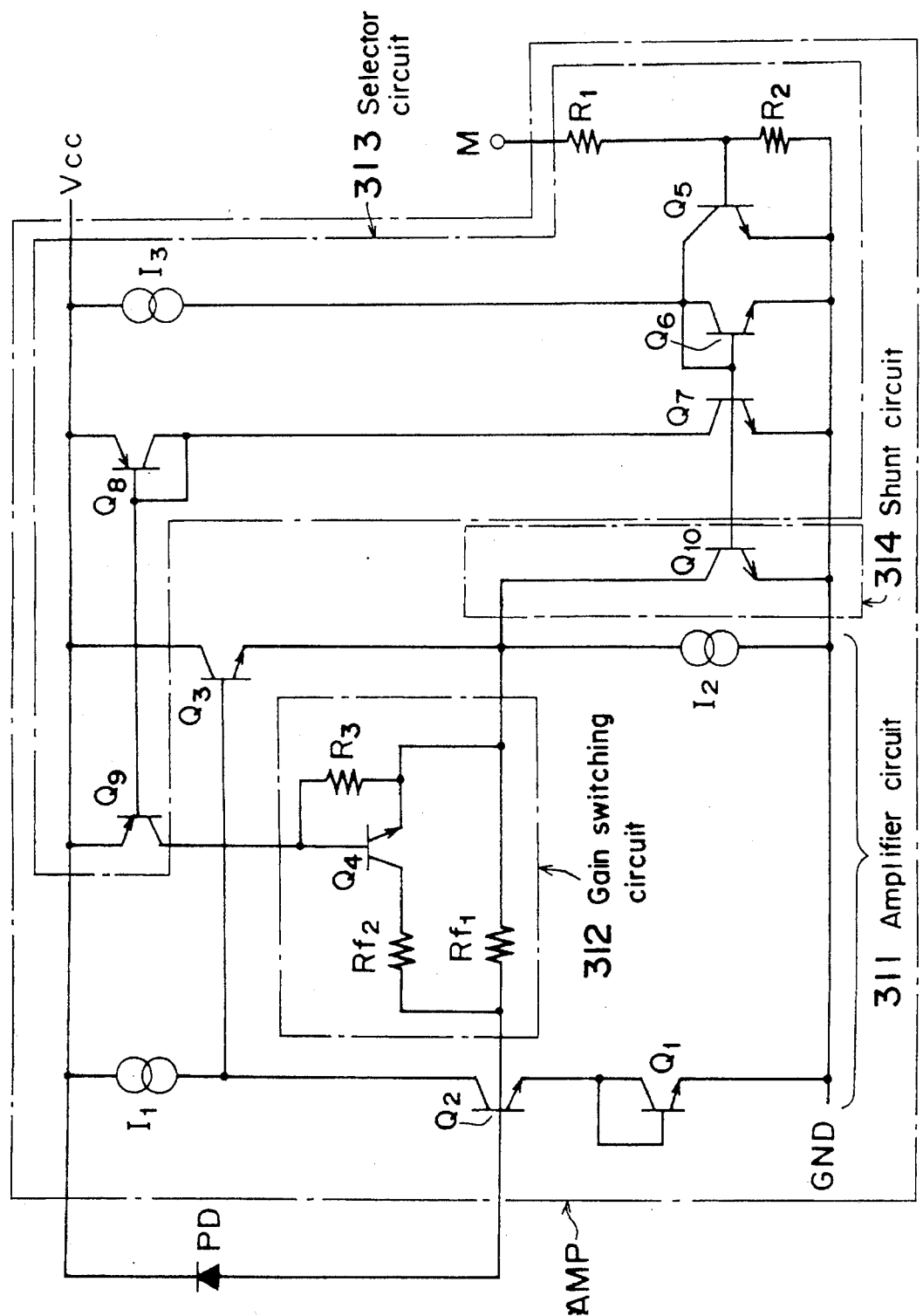
FIG. 11 is a circuit diagram of a part of the light-receiving and amplifying device shown in FIG. 10.

FIG. 11 is a circuit diagram of the light-receiving and amplifying device of the embodiment shown in FIG. 10, where one of four sets of the photodiodes PD and amplifiers AMP is shown. The following describes in detail the light-receiving and amplifying device with reference to FIG. 11.

The anode of the photodiode PD is connected to the base terminal of the NPN transistor $Q_2$, i.e., an input terminal of the amplifier AMP.

The amplifier AMP is approximately composed of an amplifier circuit 311 which converts a photocurrent from the photodiode PD into a voltage and amplifies the voltage, a gain switching circuit 312 which serves as a feedback circuit and which is connected across the input and the output of the amplifier circuit 311, a selector circuit 313 which receives an external selection signal M to control the gain switching circuit 312, and a shunt circuit 314 which shunts an output of the amplifier circuit 311 to the ground GND.

The cathode of the photodiode PD is connected to the power source $V_{CC}$.

The amplifier circuit 311 is approximately composed of three NPN transistors $Q_1$, $Q_2$, and $Q_3$ and two constant-current sources $I_1$ and $I_2$.

In the above case, the NPN transistor $Q_2$ has its base on the input side connected to the anode of the photodiode PD, and has its collector connected to the power source $V_{CC}$ via a constant-current source $I_1$. The NPN transistor $Q_1$ has its collector connected to the emitter of the NPN transistor $Q_2$, has its emitter connected to the ground GND, and has its base connected to its collector to operate as a diode. The NPN transistor $Q_3$ has its base connected to the collector of the NPN transistor $Q_2$, has its collector connected to the power source $V_{CC}$, and has its emitter connected to the ground GND via a constant-current source $I_2$ which serves as a load.

The NPN transistor $Q_3$ constitutes an emitter-follower circuit to output a voltage from its emitter. The constant-current source $I_1$ flows a current from the power source $V_{CC}$ to the NPN transistor $Q_2$, while the constant-current source $I_2$ flows a current from the NPN transistor $Q_3$ to the ground GND.

The gain switching circuit 312 is composed of a resistor $Rf_1$ connected across the base of the NPN transistor $Q_2$, i.e., the input of the amplifier circuit 311 and the emitter of the NPN transistor $Q_3$. i.e., the output of the amplifier circuit 311, a resistor $Rf_2$ and an NPN transistor $Q_4$ connected in series from the side of the NPN transistor $Q_2$ across the base of the NPN transistor $Q_2$ and the emitter of the NPN transistor $Q_3$, and a resistor $R_3$ connected across the base and the emitter of the NPN transistor $Q_4$.

The NPN transistor $Q_4$ has its collector connected to one terminal of the resistor $Rf_2$, and has its emitter connected to the emitter of the NPN transistor $Q_3$. The resistor $R_3$ operates to reduce the switching time of the NPN transistor $Q_4$.

The selector circuit 313 is approximately composed of a constant-current source $I_3$ which has its one terminal connected to the power source $V_{CC}$, NPN transistors $Q_5$, $Q_6$, and $Q_7$, and PNP transistors $Q_8$ and $Q_9$.

In the above case, the NPN transistor $Q_6$ has its collector connected to the other terminal of the constant-current source $I_3$, has its emitter connected to the ground GND, and has its base connected to its collector. The NPN transistor $Q_7$ has its base connected to the base of the NPN transistor $Q_6$, has its emitter connected to the ground GND, and has its collector connected to the collector of the PNP transistor $Q_8$. The PNP transistor $Q_8$ has its emitter connected to the power source $V_{CC}$, and has its base connected to its collector. The PNP transistor $Q_9$ has its emitter connected to the power source $V_{CC}$, has its collector connected to the base of the NPN transistor $Q_4$, and has its base connected to the base of the PNP transistor $Q_8$. The NPN transistor $Q_5$ has its collector connected to the collector of the NPN transistor $Q_6$, has its emitter connected to the ground GND, and has its base connected to an input terminal of a selection signal M via a resistor $R_1$ with the base connected to the ground GND via a resistor $R_2$.

The shunt circuit 314 is composed of an NPN transistor $Q_{10}$. The NPN transistor $Q_{10}$ has its emitter connected to the ground GND, has its collector connected to the emitter of the NPN transistor $Q_3$, i.e., the output of the amplifier circuit 311, and has its base connected to the base of the NPN transistor $Q_7$ of the selector circuit 313.

The pair of the NPN transistors $Q_6$ and $Q_7$ and the pair of the PNP transistors $Q_8$ and $Q_9$ each form a current mirror circuit. The collector of the PNP transistor $Q_9$ of the selector circuit 313 is connected to the control terminal of base of the NPN transistor $Q_4$ of the gain switching circuit 312. The collector of the NPN transistor $Q_{10}$ of the shunt circuit 314 is connected to the output side of the amplifier circuit 311.

When a photocurrent flows through the photodiode PD from the power source $V_{CC}$ to the NPN transistor $Q_2$ in the light-receiving and amplifying device having the above-mentioned construction, a part of the photocurrent flows into the base of the NPN transistor $Q_2$, and the remaining part of the current flows into the gain switching circuit 312. Therefore, a part of the current from the constant-current source $I_1$ flows to the ground GND via the NPN transistor $Q_2$ and the NPN transistor $Q_1$, while the remaining part of the current flows into the base of the NPN transistor $Q_3$. Then a specified current determined by the constant-current source $I_2$ flows from the power source $V_{CC}$ to the ground GND via the NPN transistor $Q_3$ and the constant-current source $I_2$.

Thus the amplifier AMP converts the photocurrent into a voltage and amplifies the voltage based on the gain set up by the gain switching circuit 312 to output a voltage from the emitter of the NPN transistor $Q_3$.

When the selection signal M input to the input terminal of the selector circuit 313 has an H level in the above case, a current flows into the base of the NPN transistor $Q_5$ of the selector circuit 313 via the resistor $R_1$. Consequently, the NPN transistor $Q_5$ is turned on to flow a current from the constant-current source $I_3$ to the ground GND via the NPN transistor $Q_5$. Therefore, no current flows through the bases of the two NPN transistors $Q_6$ and $Q_7$ constituting the current mirror circuit, which results in turning off both the NPN transistors $Q_6$ and $Q_7$. Therefore, no current flows through the bases of the two PNP transistors $Q_8$ and $Q_9$ constituting the current mirror circuit, which results in turning off both the PNP transistors $Q_8$ and $Q_9$.

In other words, when the selection signal M has the H level, the NPN transistor $Q_4$ of the gain switching circuit 312 is turned off. Therefore, the feedback resistance of the gain switching circuit 312 is achieved by the resistor $Rf_1$ to make the equivalent gain resistance of the amplifier AMP be "$R_{f1}$".

Meanwhile, since no current flows through the current mirror circuit composed of the NPN transistors $Q_6$ and $Q_7$, no current flows through the base of the NPN transistor $Q_{10}$ of the shunt circuit 314, which results in turning off the NPN transistor $Q_{10}$.

In other words, when the selection signal M has the H level, a specified current determined by the constant-current source $I_2$ flows through the NPN transistor $Q_3$ in a manner as described above.

When the selection signal M has an L level, the NPN transistor $Q_5$ of the selector circuit 313 is turned off. Therefore, a current from the constant-current source $I_3$ flows through the current mirror circuit composed of the NPN transistors $Q_6$ and $Q_7$, while a current having the same magnitude as that of the current of the constant-current source $I_3$ flows through the current mirror circuit composed of the PNP transistors $Q_8$ and $Q_9$. Consequently, a current having the same magnitude as that of the current of the constant-current source $I_3$ flows through the base of the NPN transistor $Q_4$ of the gain changeover circuit 312, which results in turning on the NPN transistor $Q_4$.

In other words, when the selection signal M has the L level, the feedback resistance of the gain switching circuit 312 is achieved by a synthetic resistance composed of a parallel connection of the sum of the ON-state resistance of the NPN transistor $Q_4$ and the resistor $Rf_2$ with the resistor $Rf_1$. Consequently, the equivalent gain resistance of the amplifier AMP coincides with the value "$Rf_3$ ($<Rf_1$)" of the synthetic resistance.

In the above case, the current from the constant-current source $I_3$ flows through the current mirror circuit composed of the NPN transistors $Q_6$ and $Q_7$, and a part of the current flows into the base of the NPN transistor $Q_{10}$. Therefore, the NPN transistor $Q_{10}$ is turned on.

In other words, when the selection signal M has the L level, the specified current determined by the constant-current source $I_2$ which flows via the NPN transistor $Q_3$ is partially shunted to the ground GND via the shunt circuit 314. Thus the current drive capability of the amplifier circuit 311 is changed to the lower side.

Thus, according to the fourth embodiment, the equivalent gain resistance of the amplifier AMP can be changed according to the level of the selection signal M.

Therefore, when the present light-receiving and amplifying device is employed in a pickup for the mini-disc, the following effects are produced.

When the quantity of light incident on the photodiode PD is small in, for example, the stage of reading the disc, the value of the feedback resistance of the gain switching circuit 312 is set at the value of "$Rf_1$" to set the feedback resistance at a great value within a range in which the amplifier circuit 311 is not saturated. When the quantity of light incident on the photodiode PD is great in, for example, the stage of writing on the disc, the value of the feedback resistance of the gain switching circuit 312 is set at the value of "$Rf_3$" to set the feedback resistance at a small value within a range in which the amplifier circuit 311 is not saturated.

Thus by changing over the feedback resistance of the gain switching circuit 312 between "$R_{f1}$" and "$R_{f3}$" through control of the level of the selection signal M according to the quantity of light incident on the photodiode PD, the signal-to-noise ratio of the amplifier AMP can be increased without saturating the amplifier AMP over a wide range in quantity of light incident on the photodiode PD.

In the fourth embodiment, the shunt circuit 314 is provided in between the output of the amplifier circuit 311 and the ground GND. Then, according to the level of the selection signal M (i.e., in synchronization with the NPN transistor $Q_4$ for changing the gain), the NPN transistor $Q_{10}$ of the shunt circuit 314 is controlled to be turned on and off. Therefore, the output current of the amplifier circuit 311 can be changed to the side of the smaller current when the NPN transistor $Q_4$ for changing the gain is switched to the ON-state.

In other words, according to the present embodiment, in reducing the gain of the amplifier AMP by turning on the NPN transistor $Q_4$ for changing the gain for the reason that the quantity of light incident on the photodiode PD is great, a great current is supplied to the NPN transistor $Q_4$ without excessively increasing the circuit current to allow the transistor to be operated stably without increasing the ON-state resistance of the transistor.

Although a set of the NPN transistor $Q_4$ for changing the gain and the resistor $Rf_2$ is employed in the gain switching circuit 312 in the fourth embodiment, it is permitted to employ two or more sets of such elements.

Although the NPN transistor is employed as the switching element for changing the gain of the amplifier AMP in the fourth embodiment, it is of course permitted to employ a CMOS (Complementary Metal Oxide Semiconductor) analog switch or a switching element equivalent to the above-mentioned element.

As is apparent from the above description, in the light-receiving and amplifying device of the fourth embodiment, the magnitude of the output current from the amplifier circuit is changed by the current switching circuit in synchronization with turning on and off the switching element of the gain switching circuit connected across the input and the output of the amplifier circuit. With the above-mentioned arrangement, the output current of the amplifier circuit can be changed over to the side of the small current when, for example, the switching element is turned on based on the selection signal.

Therefore, according to the fourth embodiment, even when a great current is supplied to the switching element for the purpose to assure stable operation of the switching element in changing the gain of the amplifier circuit through the control of turning on and off the switching element of the gain switching circuit for the purpose to obtain a high signal-to-noise ratio over a wide range in quantity of incident light, the circuit current can be prevented from being excessively increased.

Furthermore, according to the light-receiving and amplifying device of the fourth embodiment, the current switching circuit is composed of a shunt circuit which has its one terminal connected to the output terminal of the amplifier circuit and includes the second switching element, and the second switching element is controlled to be turned on and off according to the selection signal. With the above-mentioned arrangement, the output current of the amplifier circuit is shunted by the shunt circuit to allow the operation of the amplifier circuit to be changed to the side of the small current when the switching element is turned on based on the selection signal.

Therefore, according to the fourth embodiment, the circuit current can be prevented from being excessively increased when a great current is supplied to the switching element for the purpose to assure stable operation of the switching element of the gain switching circuit.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light-receiving and amplifying device having a photodiode and an amplifier circuit which amplifies a photocurrent from the photodiode through current-to-voltage conversion of the photocurrent, the light-receiving and amplifying device comprising:

a gain switching circuit which switches the amplifier circuit between two or more gain levels, said gain switching circuit including at least one set of a resistor and a switching element connected in series across an input and an output of the amplifier circuit, said switching element including a control terminal, and a gain selection circuit for selecting one of said two or more gain levels in response to an external selection signal, said gain selection circuit including a current mirror circuit which is responsive to the external selection signal and connected directly to the control terminal of said switching element, whereby the amplifier circuit is prevented from being saturated over a wide range of light quantity incident on the photodiode and signal to noise ratio is increased.

2. A light-receiving and amplifying device having a photodiode and an amplifier circuit which amplifies a photocurrent from the photodiode through current-to-voltage conversion of the photocurrent, the light-receiving and amplifying device comprising:

a current mirror circuit directly connected to the photodiode and which outputs a control signal of a current having a magnitude approximately equal to a magnitude of the photocurrent from the photodiode; and a gain selection circuit for selecting one of at least two gain levels for said amplifier in response to the control signal output by said current mirror circuit and an external selection signal, said gain selection circuit including two further current mirror circuits connected to output a further control signal, a gain switching circuit including at least one set of a resistor and a switching element connected in series across an input and an output of the amplifier circuit, said gain switching circuit including a control terminal connected to receive said further control signal whereby dependent on said external selection signal assuming a preselected condition the further control signal produces a current flow to the control terminal of the gain switching circuit which is approximately of the same magnitude as that of the photocurrent from the photodiode.

3. A light-receiving and amplifying device having a photodiode and an amplifier circuit which amplifies a photocurrent from the photodiode through current-to-voltage conversion of the photocurrent, the light-receiving and amplifying device comprising:

a gain switching circuit for switching the amplifier circuit between two or more gain levels and including at least one set of a resistor and a switching element connected in series across an input and an output of the amplifier circuit, said switching element including a control terminal;

a gain selection circuit responsive to an external selection signal for selecting one of said two or more gain levels, said gain selection circuit including a current mirror circuit which generates a control signal of a specified current correlating with a current amplification factor according to a level of the external selection signal and said current mirror circuit being directly connected to said control terminal for supplying the control signal to the control terminal of the switching element of the gain switching circuit.

4. A light-receiving and amplifying device having a photodiode and an amplifier circuit which amplifies a photocurrent from the photodiode through current-to-voltage conversion of the photocurrent, the light-receiving and amplifying device comprising:

a gain switching circuit which changes a gain of the amplifier circuit by turning on and off a switching element built therein according to a level of an external selection signal, the gain switching circuit being connected across an input and an output of the amplifier circuit, said switching element having a control terminal connected directly to the output of a current mirror circuit, said current mirror circuit producing an output in accordance with the level of said external selection signal;

a further current switching circuit which changes a magnitude of an output current of the amplifier circuit in synchronization with the turning on or off of the switching element; and wherein the device is used for reading from or writing on an optical disk and said gain switching circuit switches the amplifier to a high gain level for reading and a low gain level for writing.

5. A light-receiving and amplifying device as claimed in claim 4, wherein the current switching circuit is a shunt circuit which has its one terminal connected to an output terminal of the amplifier circuit and includes a second switching element, and the selection signal is input to a control terminal of the second switching element.

6. A light-receiving and amplifying device as in claim 1 wherein said gain selection circuit further includes a switching circuit for receiving said external selection signal and for controlling a current flow through the current mirror.

7. A light-receiving and amplifying device as in claim 1 wherein the device is used for reading from or writing on an optical disk and said gain switching circuit switches the amplifier to a high gain level for reading and a low gain level for writing.

8. A light-receiving and amplifying device as in claim 2 wherein said gain selection circuit further includes a switching circuit for receiving said external selection signal and for controlling a current flow through the current mirror.

9. A light-receiving and amplifying device as in claim 2 wherein the device is used for reading from or writing on an optical disk and said gain switching circuit switches the amplifier to a high gain level for reading and a low gain level for writing.

10. A light-receiving and amplifying device as in claim 3 wherein said gain selection circuit further includes a switching circuit for receiving said external selection signal and for controlling a current flow through the current mirror.

11. A light-receiving and amplifying device as in claim 3 wherein the device is used for reading from or writing on an optical disk and said gain switching circuit switches the amplifier to a high gain level for reading and a low gain level for writing.

12. A light-receiving and amplifying device as in claim 4 further including another switching circuit for receiving said external selection signal and for controlling the current flow through the current mirror.

* * * * *